United States Patent
Hara et al.

(10) Patent No.: US 8,826,099 B2
(45) Date of Patent: Sep. 2, 2014

(54) MEMORY CONTROLLER, SEMICONDUCTOR MEMORY SYSTEM, AND MEMORY CONTROL METHOD

(75) Inventors: Tokumasa Hara, Kanagawa (JP); Osamu Torii, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 42 days.

(21) Appl. No.: 13/594,116

(22) Filed: Aug. 24, 2012

(65) Prior Publication Data

US 2013/0104002 A1    Apr. 25, 2013

(30) Foreign Application Priority Data

Oct. 19, 2011    (JP) ................... 2011-229926

(51) Int. Cl.
*H03M 13/05*    (2006.01)
*G06F 11/10*    (2006.01)
*H03M 13/11*    (2006.01)
*H03M 13/15*    (2006.01)

(52) U.S. Cl.
CPC ....... *G06F 11/1072* (2013.01); *H03M 13/1102* (2013.01); *H03M 13/1515* (2013.01); *H03M 13/152* (2013.01)
USPC .................... 714/763; 714/E11.034

(58) Field of Classification Search
CPC ............ G06F 11/1076; G06F 11/1008; G06F 11/1044; G06F 11/1068; H05K 999/99
USPC .................... 714/763, 768, E11.034
See application file for complete search history.

(56) References Cited

U.S. PATENT DOCUMENTS

| | | | |
|---|---|---|---|
| 7,096,406 B2 | 8/2006 | Kanazawa et al. | |
| 7,493,457 B2 * | 2/2009 | Murin | .......................... 711/157 |
| 7,526,715 B2 | 4/2009 | Litsyn et al. | |
| 7,681,109 B2 | 3/2010 | Litsyn et al. | |
| 7,978,512 B2 | 7/2011 | Shiga | |
| 8,179,719 B1 * | 5/2012 | Yang | ......................... 365/185.03 |
| 8,589,766 B2 * | 11/2013 | Post et al. | ...................... 714/766 |
| 2007/0180346 A1 | 8/2007 | Murin | |
| 2009/0070657 A1 | 3/2009 | Litsyn et al. | |
| 2011/0096601 A1 * | 4/2011 | Gavens et al. | ............ 365/185.09 |

FOREIGN PATENT DOCUMENTS

JP    4437519    1/2010

* cited by examiner

*Primary Examiner* — Sam Rizk
*Assistant Examiner* — Kyle Vallecillo
(74) *Attorney, Agent, or Firm* — Oblon, Spivak, McClelland, Maier & Neustadt, L.L.P.

(57) ABSTRACT

According to one embodiment, a memory controller that controls a non-volatile semiconductor memory including a memory cell of 3 bits/cell includes a controller that extracts bits which becomes an error caused by the movement to the adjacent threshold voltage distribution from a first bit and a second bit of data to be written in each of the memory cells to generate a virtual page and an encoding unit that generate an error correcting code for the virtual page and writes the data for three pages and the error correcting code in the non-volatile semiconductor memory.

15 Claims, 25 Drawing Sheets

FIG.7

| Page | | | | | | |
|---|---|---|---|---|---|---|
| U | 1 | 1 | 0 | 0 | 0 | 1 |
| M | 1 | 0 | 0 | 1 | 1 | 1 |
| L | 1 | 0 | 0 | 1 | 0 | 0 |

DATA

⇩ L[i] AS IT IS
UM'[i]=U[i](if L[i]=0)
M[i](otherwise)

⇧ L[i] AS IT IS
U[i]=UM'[i](if L[i]=0)
M[i]=UM'[i](if L[i]=1)
M[i](otherwise)

| Page | | | | | | |
|---|---|---|---|---|---|---|
| UM' | 1 | 0 | 1 | 0 | 1 | 1 | → PARITY IMPARTED
| L | 1 | 1 | 0 | 1 | 0 | 0 | → PARITY IMPARTED

DATA

FIG.12

| Page | | | | | | | |
|------|---|---|---|---|---|---|---|
| U | 1 | 1 | 0 | 0 | 0 | 0 | 1 |
| M | 1 | 0 | 0 | 0 | 1 | 1 | 1 |
| L | 1 | 1 | 0 | 1 | 1 | 0 | 0 |

DATA

⇩ L[i] AS IT IS
U'[i]=U[i](if L[i]=0)
    M[i](otherwise)
M'[i]=U[i](if L[i]=1)
    M[i](otherwise)

⇧ L[i] AS IT IS
U[i]=U'[i](if L[i]=0)
    M'[i](otherwise)
M[i]=U'[i](if L[i]=1)
    M'[i](otherwise)

| Page | | | | | | | | |
|------|---|---|---|---|---|---|---|---|
| U' | 1 | 0 | 1 | 0 | 1 | 0 | 1 | → PARITY IMPARTED |
| M' | 1 | 1 | 0 | 0 | 1 | 1 | 1 | → PARITY IMPARTED |
| L | 1 | 1 | 0 | 1 | 1 | 0 | 0 | → PARITY IMPARTED |

DATA

| | | | |
|---|---|---|---|
| T | USER INPUT DATA (Top Page) | T PARITY | H' PARITY | U' PARITY | L PARITY |
| H | USER INPUT DATA (Higher Page) | T PARITY | H' PARITY | U' PARITY | L PARITY |
| U | USER INPUT DATA (Upper Page) | T PARITY | H' PARITY | U' PARITY | L PARITY |
| L | USER INPUT DATA (Lower Page) | T PARITY | H' PARITY | U' PARITY | L PARITY |

1 WL

PARITY STORING AREA

MEMORY CONTROLLER, SEMICONDUCTOR MEMORY SYSTEM, AND MEMORY CONTROL METHOD

CROSS-REFERENCE TO RELATED APPLICATIONS

This application is based upon and claims the benefit of priority from Japanese Patent Application No. 2011-229926, filed on Oct. 19, 2011; the entire contents of which are incorporated herein by reference.

FIELD

Embodiments described herein relate generally to a memory controller, a semiconductor memory system, and a memory control method.

BACKGROUND

In a NAND type flash memory, generally, an error for stored data is corrected. Recently, a error probability for stored data is increased, accompanied by a miniaturization or a super value multiplexing of a NAND type flash memory.

If the error probability accompanied by the miniaturization and the super value multiplexing of a NAND type flash memory is increased, an amount of parity data required for maintaining validity of data after correcting the error is also increased. This means that memory capacity for storing the parity data is increased, which causes the increase of the cost. Alternatively, in order to suppress the increase of the cost, if the error correcting capability is left unchanged while not increasing the amount of parity data, all errors of stored data are not corrected, which increases probability of the error remaining.

BRIEF DESCRIPTION OF THE DRAWINGS

FIG. 7 is a diagram illustrating an example of a method of selecting data which is an error correcting target according to the first embodiment;

FIG. 12 is a diagram illustrating an example of a method of selecting data which is an error correcting target of the embodiment according to a second embodiment;

FIG. 17 is a diagram illustrating an example of a method of selecting data which is an error correcting target of the embodiment according to a third embodiment;

FIG. 24 is a diagram illustrating an example of positions where data and a parity are stored in a NAND flash memory according to the fourth embodiment;

DETAILED DESCRIPTION

According to embodiments, a memory controller controls a non-volatile semiconductor memory having a memory cell of three bits/cell in which 3-bit data is allocated with respect to each threshold voltage distribution such that a first bit represents data of a first page, a second bit represents data of a second page, and a third bit represents data of a third page. When three pages of data, that is, the data of the first, second, and third pages is written in a first memory region of the non-volatile semiconductor memory, the memory controller includes a controller that extracts bits which is an error due to the movement into an adjacent threshold voltage distribution from the first bit and the second bit of data which is written in each of the memory cells of the first memory region to generate a virtual page. The memory controller includes an encoding unit that generates a first error correcting code with respect to the virtual page and an interface unit that writes the three pages of data and the first error correcting code in the non-volatile semiconductor memory.

Hereinafter, a memory controller, a semiconductor memory system, and a memory control method according to embodiments will be explained below in detail with reference to the accompanying drawings. The present invention is not limited to the following embodiments.

(First Embodiment)

Figure 1:
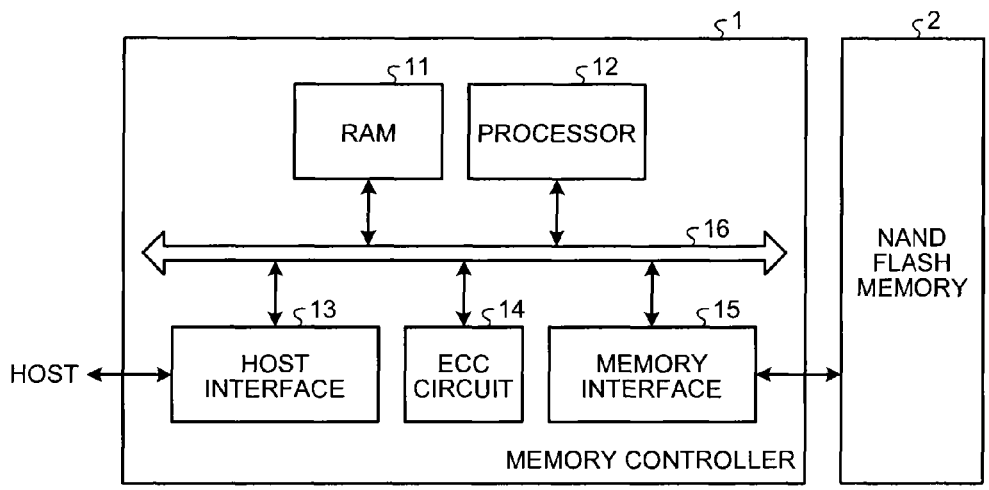
FIG. 1 is a block diagram illustrating a configuration example of a semiconductor memory system according to a first embodiment.

FIG. 1 is a block diagram illustrating a configuration example of a semiconductor memory system according to a first embodiment. The semiconductor memory system according to the first embodiment includes a memory controller 1 and a NAND flash memory (non-volatile semiconductor memory) 2. The NAND flash memory 2 is a non-volatile memory and performs write, read, and delete operations by being controlled by the memory controller 1.

The memory controller 1 includes a random access memory (RAM) 11, a processor 12, a host interface 13, an ECC (error checking and correction) circuit 14, a memory interface (interface unit) 15, and a data bus 16.

The host interface 13 includes a protocol required for data exchange with a host. Examples of host include a personal computer and a CPU (central processing unit) core. The memory interface 15 includes a protocol required for data exchange with the NAND flash memory 2 and receives/transmits an instruction, an address, a control signal, and data from/to the NAND flash memory 2.

A processor 12 is a controller that collectively controls individual components of the semiconductor memory system and includes a CPU core, a ROM (read only memory), a DMA (direct memory access) controller and the like. When receiving an instruction from the host via the host interface 13 and the data bus 16, the processer 12 performs a control operation in accordance with the instruction. For example, the processor 12 instructs the memory interface 15 to write data into the NAND flash memory 2 or read data from the NAND flash memory 2 in accordance with the instruction from the host. Further, the processor 12 instructs the ECC circuit 14 to perform an error correction encoding process or a decoding process.

The ECC circuit 14 performs an error correction encoding process for data to be written into the NAND flash memory 2 and a detecting process or a correcting process for an error of data stored in the NAND flash memory 2 at the same time in accordance with the instruction from the processor 12. The RAM 11 is used as a working memory of the processor 12. Even though not illustrated in the configuration example of FIG. 1, the memory controller 15 may further include an ROM that stores code data for interfacing with the host. As described above, the configuration example of FIG. 1 is an example, and the semiconductor memory system according to the embodiment is not limited to the configuration example of FIG. 1 but a modification of a general configuration may be applicable.

Figure 2:
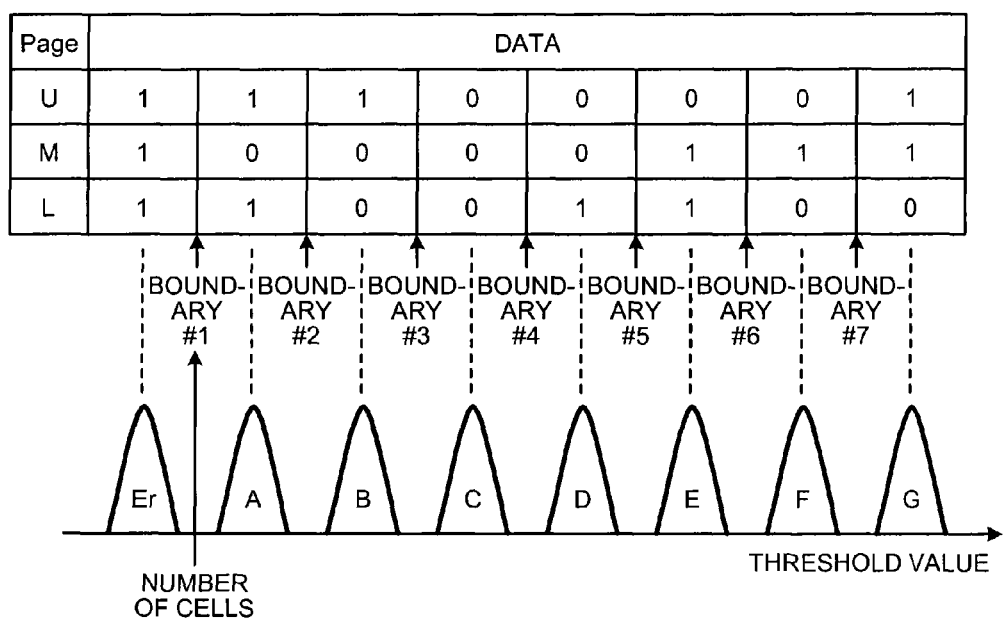
FIG. 2 is a diagram illustrating an example that allocates a threshold voltage of a memory cell into data according to the first embodiment.

The NAND flash memory 2 stores 3 bits or more of data in one memory cell. In the embodiment, an example that 3-bit data are stored in one memory cell will be described. FIG. 2 is a diagram illustrating an example that allocates a threshold voltage of a memory cell into data when data is stored in the memory cell of the NAND flash memory 2. In order to store 3-bit data in one memory cell, eight kinds of threshold voltage distribution are defined using boundaries #1 to #7, which are seven boundary threshold voltages. The NAND flash memory 2 reads and writes data in the unit of page. Generally, in a multiple-valued cell, a different page is allocated into each bit stored in one memory cell. Here, page addresses corresponding to 3 bits are referred to as U (upper), M (middle), and L (lower), respectively.

The drawing shown in the upper side of FIG. 2 illustrates an example that the combination of data values of pages stored in every memory cell corresponds to a threshold voltage of the memory cell. The drawing shown in the lower side of FIG. 2 illustrates an example of distribution (threshold voltage distribution) of cell numbers when a horizontal axis represents the threshold voltage of the memory cell and a vertical axis represents the number of cells. In the allocation of data illustrated in FIG. 2, data allocated into the adjacent threshold voltage distribution becomes a so-called gray code of which data has one bit difference, and the reason will be described later.

As illustrated in FIG. 2, as seen from pages U, M, and L, in the page U, the number of boundaries having a value of data of 1 to 0 or 0 to 1 is two (boundaries #3 and #7 of FIG. 2). In the page M, the number of boundaries is two (boundaries #1 and #5 of FIG. 2) and in the page L, the number of boundaries is three (boundaries #2, #4, and #6 of FIG. 2). Hereinafter, the allocation of the boundary number into the pages is referred to as 2-2-3 division by representing the boundary number (divisional number) in the order of U, M, and L. The allocation of the boundary number into the pages is not limited thereto but another example will be described later.

Next, overall read and write operations of the NAND flash memory 2 according to the embodiment will be described. First, when the processor 12 is instructed by the host to write data, the processor 12 instructs the ECC circuit 14 to perform the error correction encoding of data. Data of a write target which is transmitted from the host is temporarily stored in the RAM 11. The ECC circuit 14 performs the error correction encoding process based on the data stored in the RAM 11 and generates an error correction code.

The processor 12 instructs the memory interface 15 to write data and an error correction code generated for the data (hereinafter, referred to as a parity in the embodiment) into the NAND flash memory 2. In this case, a write address of data and error correction codes are instructed to the memory interface 15 and the memory interface 15 writes the data and the parity into the instructed address. The processor 12 stores the correspondence of a logical address and a physical address of the NAND flash memory 2 and designates a physical address as the write address with respect to the memory interface 15. Here, an example that the logical address and the physical address are directly converted at the time of writing has been described. However, the invention is not limited thereto, but the addresses may be converted through multiple stages (for example, after temporarily converting the logical address of a host device into a logical address of the semiconductor memory system, the logical address is then converted into the physical address).

When the processor 12 is instructed by the host to read data, the processor 12 instructs the memory interface 15 to read the data from the NAND flash memory 2. Since the host designates the data, which is the read target by the logical address, the processor 12 instructs the corresponding physical address to the memory interface 15 based on the stored correspondence of the logical address and the physical address of the NAND flash memory 2. In this case, the processor 12 also reads the parity corresponding to the read data. The processor 12 instructs the ECC circuit 14 to perform the error correction decoding process based on the read data and parity. The ECC circuit 14 performs the error correction decoding process based on the instruction. The processor 12 transmits data on which the error correction decoding process is performed to the host via the host interface 13.

Figure 3:
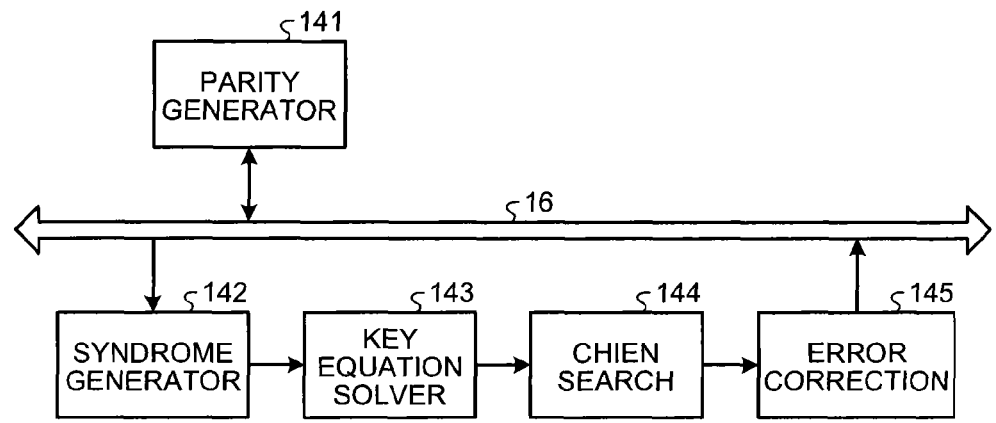
FIG. 3 is a diagram illustrating a configuration example of an ECC circuit.

FIG. 3 is a diagram illustrating a configuration example of the ECC circuit 14. The ECC circuit 14 illustrated in FIG. 3 is an ECC circuit that adopts a BCH method. In the ECC circuit 14, when data is written into the NAND flash memory 2, a parity generator (encoding unit) 141 generates a parity by performing the error correction encoding process based on a predetermined size of write data which is input via the data bus 16. The predetermined size may be set to be an arbitrary number, and for example, the predetermined size is a sector size. The sector size, for example, is 512 bytes (4096 bits). The parity generator 141 sends the generated parity to the data bus.

Each unit of a syndrome generator 142, a key equation solver 143, a Chien search 144, and an error correction 145 constitutes an error correcting unit which is used to read data from the NAND flash memory 2, detects the presence of an error of read data and outputs error correction data. The read data is input to the syndrome generator 142 from the data bus 16. The syndrome generator 142 forms a syndrome based on the input data and inputs the syndrome to the key equation solver 143. The key equation solver 143 derives an error position polynomial equation using the syndrome and judges number of bits of the error. When the number of error bits is larger than 1, the key equation solver 143 inputs the error position polynomial equation to the Chien search 144. The Chien search 144 specifies the location of the bit of the error based on the input error position polynomial equation. The error correction 145 corrects the error by inverting the bit data in accordance with the location of the bit of the error.

The configuration of FIG. 3 is an example, and in the embodiment, the configuration of the ECC circuit 14 is not limited to the example of FIG. 3. The error correcting method is put to practical use by various methods such as BCH, a Reed-Solomon code, LDPC (low density parity check). The error correcting method is not limited to the BCH, but any method may be used therefor.

The error of the data stored in the NAND flash memory will be described. There are various causes of the error occurring in data stored in the NAND flash memory. Representative causes include charge leakage, a soft program, and an over program.

Figure 4:
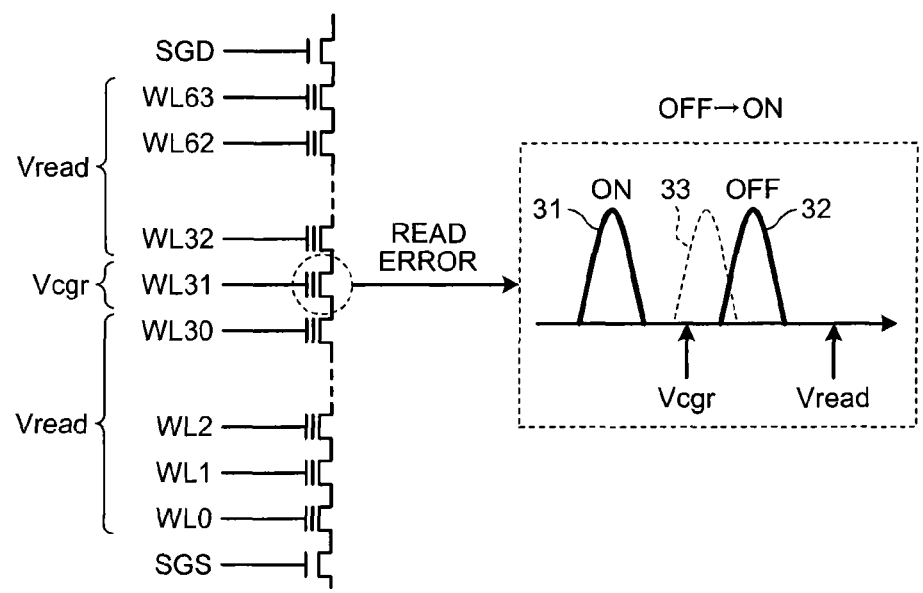
FIG. 4 is a diagram illustrating an aspect that an error occurs by charge leakage.

FIG. 4 is a diagram illustrating an aspect that an error occurs by the charge leakage. A memory cell of the NAND flash memory is classified into an ON cell and an OFF cell depending on a threshold voltage distribution. The ON cell stores data "1" and the OFF cell stores data "0". The error caused by the charge leakage is an error that a cell which is written and stored as an OFF cell is read as an ON cell.

The charge leakage refers that an electron trapped in a floating gate or an oxide film of the memory cell leaks to a channel of the memory cell through the oxide film. In the NAND flash memory, in the reading operation, a selective reading voltage Vcgr is applied to a selective word line (in FIG. 4, WL31 is a selective word line) and a non-selective read voltage Vread is applied to non-selective word lines (WL0 to WL30 and WL32 to WL63). Vread is a high voltage enough to turn on a memory cell connected to the non-selective word line. When the charge leakage occurs in the memory cell connected to the selective word line, a threshold voltage of the memory cell is decreased and the threshold voltage distribution of the OFF cell moves toward the ON cell.

The distribution 31 of FIG. 4 represents the distribution of the threshold voltages of the ON cell when the charge leakage does not occur and the distribution 32 represents the distribution of the threshold voltages of the OFF cell when the charge leakage does not occur. When the charge leakage occurs, the distribution of the threshold voltages of the OFF cell is lowered as illustrated by the dotted-line distribution 33. As described above, if the threshold voltage lowered by the charge leakage becomes smaller than Vcgr, the memory cell which is originally the OFF cell is read as an ON cell in the reading operation, which causes an error.

Figure 5:
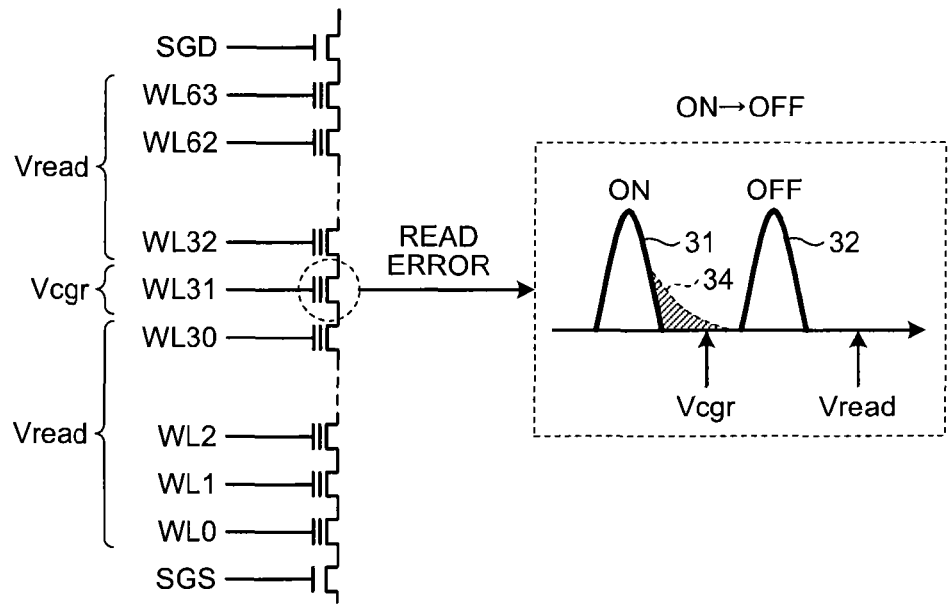
FIG. 5 is a diagram illustrating an aspect that an error occurs by a soft program.

FIG. 5 is a diagram illustrating an aspect that an error occurs by a soft program. The error by the soft program refers that the non-selective reading voltage is applied in the reading operation so that a small amount of electrons flow into the floating gate from the channel. The error caused by the soft program is an error that a memory cell that is not written and is an ON cell is read as an OFF cell.

The distribution 31 of FIG. 5 represents the distribution of the threshold voltages of the ON cell when the error of the soft program does not occur and the distribution 32 represents the distribution of the threshold voltages of the OFF cell when the soft program does not occur. When the error by the soft program occurs in the memory cell connected to the selective word line WL31, the threshold voltage of the memory cell increases as illustrated by the distribution 34 and the distribution of the threshold voltages of the ON cell moves toward the OFF cell. If the threshold voltage is higher than Vcgr, the memory cell which is originally the ON cell is read as an OFF cell in the reading operation, which causes an error.

Figure 6:
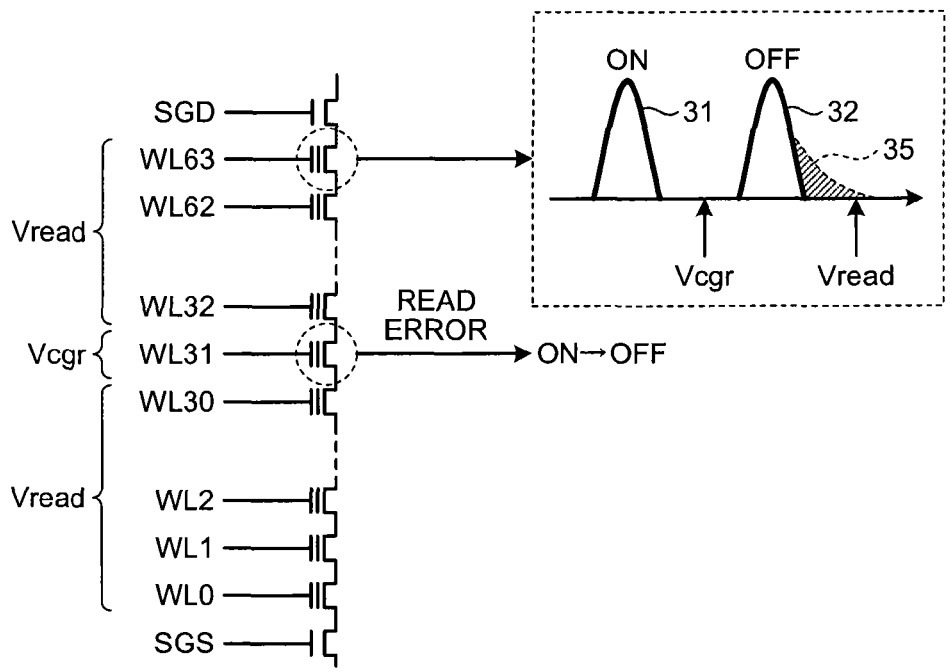
FIG. 6 is a diagram illustrating an aspect that an error occurs by an over program.

FIG. 6 is a diagram illustrating an aspect that an error occurs by an over program. The error by the over program refers that after a memory cell having relatively high write speed at the time of writing is written, the memory cell has the threshold voltage higher than a upper limit voltage. The distribution 31 represents the distribution of the threshold voltages of the ON cell when the over program does not occur and the distribution 32 represents the distribution of the threshold voltages of the OFF cell when the over program does not occur. The distribution 35 represent the distribution of the threshold voltages of the memory cell which exceed the upper limit voltage by the over program. The upper limit voltage is required to be lower than Vread. However, usually, it is not checked whether the threshold voltage exceeds the upper limit voltage in the write operation.

The error caused by the over program is an error that the memory cell that is not written and is an ON cell is read as an OFF cell. In the read operation, even though Vcgr is applied to the selective word line WL31 and the memory cell which is the read target is precisely turned on, if the over program occurs in the memory cell connected to the non-selective word lines WL0 to WL30 and WL32 to WL63 on the same cell string, a channel resistance of the cell string is increased. If the channel resistance is increased, the selective memory cell which is an ON cell is read as if the cell is turned off, which causes an error.

Among the three representative causes of error described above, the charge leakage and the soft program are caused when the threshold voltage distribution moves. In the case of a multiple-valued memory cell, a threshold voltage distribution is erroneously read as an adjacent threshold voltage distribution. If data is allocated by a gray code as illustrated in FIG. 2, the amount of error caused by the above causes may be contained within 1 bit in the memory cell. For example, in the example of FIG. 2, the distribution A between the boundaries #1 and #2 may be read either as a distribution Er below the boundary #1 or as a distribution B between the boundaries #2 and #3. If the distribution A is read as the distribution Er, 1 bit error may occur in the page M. Alternatively, if the distribution A is read as the distribution B, 1 bit error may occur in the page L.

In the meantime, according to the above-mentioned over program, the threshold voltage distribution is read as if the distribution moves to the distribution of uppermost voltages. Therefore, 2 bit error may also occur. Further, a defect cell in which a memory cell is physically broken is generally excluded by a manufacturing test process of a memory chip or substituted by a redundancy memory cell. However, the defect cell may be broken by fatigue during the subsequent usage processes. The erroneous behavior of the defect cell during the reading operation is hardly estimated and an error may occur in all 3 bits.

Usually, it is observed that after passing through an appropriate manufacturing test process, most of causes of error are the movement of the threshold voltage distribution to the neighbor due to the charge leakage and the soft program. In the embodiment and following embodiments, a target of error correction is limited to the movement of the threshold voltage distribution to the neighbor or the movement of the threshold voltage distribution to the neighbor is set as a main target of error correction, which allows the cost to be reduced without lowering the error correcting capability or allows the error correcting capability to be improved without increasing the cost. Hereinafter, even though an example that reduces the cost without lowering the error correcting capability is mainly described, it is obvious that the error correcting capability is improved without increasing the cost by the same method.

FIG. 7 is a diagram illustrating an example of a method of selecting data which is an error correcting target according to the first embodiment. In FIG. 7, the data allocation illustrated in FIG. 2 is presumed. If the cause of the error is the movement to the adjacent threshold voltage distribution, an error does not occur in data which is not changed in adjacent threshold voltage distributions at both sides. In FIG. 7, between the pages U and M, data other than data enclosed by broken lines is not changed even when the threshold voltage distribution moves to the adjacent distribution. For example, when the distribution moves to the adjacent threshold voltage distribution, second data from the left "1, 0, 1" (=data of the page U, data of the page M, and data of the page L) becomes "1, 1, 1" or "1, 0, 0". However, in any cases, data of the page U is not changed but maintained as "1".

In the page L, in case of the distribution Er and the distribution G illustrated in FIG. 2, actually, even when the distribution moves to the adjacent threshold voltage distribution, the data is not changed. However, in this description, in order to simplify the procedures, it is assumed that in the page L, a data error occurs in all data.

In the embodiment, in the pages U and M, only data enclosed by the broken lines of which value is changed by the movement to the adjacent threshold voltage distribution is treated as the error correcting target (a parity imparted target). In the page L, all data is treated as the error correction target. Among data of the pages U and M, a virtual page UM' from which the error correction target is extracted is temporarily generated and a parity is imparted to the data of the virtual page UM'.

The drawing of the lower side of FIG. 7 illustrates a method of extracting the virtual page UM'. As understood when comparing with the drawing of the upper side of FIG. 7, in the threshold voltage distribution corresponding to data enclosed by the broken lines in the page U, data of the page M is not enclosed by the broken lines. Similarly, in the threshold voltage distribution corresponding to data enclosed by the broken lines in the page M, data of the page U is not enclosed by the broken lines. Accordingly, as the virtual page UM', data in any one of the pages U and M may be extracted with respect to the threshold voltage distribution.

Next, a method of generating the virtual page UM' will be described. Here, a method that generates the virtual page UM' based on a value of the data of the page L will be described. The method of generating the virtual page UM' is not limited thereto. For example, the correspondence of whether to extract data of the page U or data of the page M for every threshold voltage distribution may be stored and the corresponding threshold voltage distribution may be discriminated based on values of 3-bit data of the pages U, M, and L to extract the data based on the stored correspondence to generate the virtual page UM'.

The data of the virtual page UM' is supposed to be UM'[i] (i is an integer indicating a data number in the page). In this case, a rule that generates the virtual page UM' based on the value of the data of the page L is represented by the following Equation (1).

$UM'[i]=U[i]$ (if $L[i]=0$)

$M[i]$ (otherwise)         (1)

A parity is generated based on a predetermined size of data of the generated virtual page UM' and is written together with the write data during the write operation into the NAND flash memory 2. With respect to the page L, the parity is generated based on the predetermined size of data which is similar to the related art. Therefore, in the embodiment, the parity is imparted with respect to the data of the two pages L and UM'. As compared with a method that imparts a parity with respect to data of three pages L, M, and N in the related art, the data which is the parity imparting target is reduced in the embodiment.

Figure 8:
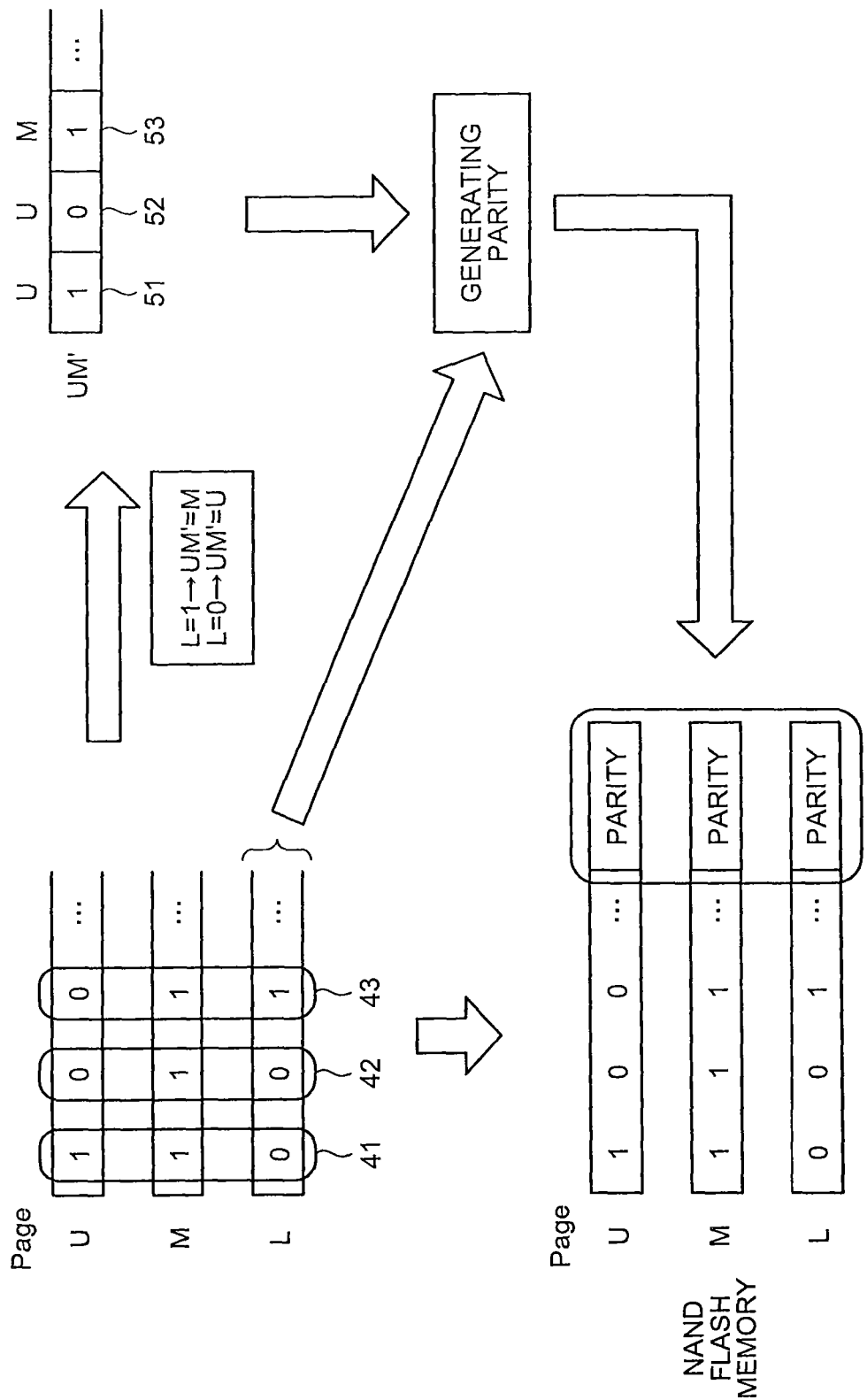
FIG. 8 is a diagram illustrating an example of a procedure of generating a virtual page UM' and a procedure of generating a parity.

FIG. 8 is a diagram illustrating an example of a procedure of generating a virtual page UM' and a procedure of generating a parity. The drawing of the upper left side of FIG. 8 illustrates a state where the processor 12 allocates the data transmitted from the host into each of the pages. Data 41, 42, and 43 is 3-bit data which is stored in one memory cell respectively. Data 51, 52, and 53 is data of the virtual page UM' which is generated based on the data 41, 42, and 43, respectively. If the UM'[i] is extracted according to the above-mentioned Equation (1), it is illustrated in drawing of the upper right side of FIG. 8. Here, as an example, the number (i) indicating the data 41, 42, and 43 is 1, 2, and 3. Since the data of the page L is "0", the data 41 becomes UM'[1]=U[1]=1 according to Equation (1). Since the data of the page L is "1", the data 43 becomes UM'[3]=M[3]=1 according to Equation (1).

The parity is generated based on the data of the virtual page UM' and the data of the page L, and the data and the parities of the pages U, M, and L are written as illustrated in the drawing of the lower left side of FIG. 8.

By adopting a method of adding the parity as described above, the parity data size can be reduced. Hereinafter, an example of numerical values will be described. It is assumed that the amount of one page of user data is 4096 bits and the ECC circuit 14 that is capable of correcting 40 bits thereof is used. The amount of parity data that is capable of correcting 40 bits out of 4096 bits is 520 bits as a minimum amount of data by the BCH method (40 bits×13; 13=12+1; 4096=$2^{12}$).

Therefore, in the related art that adds the parity to each of the pages, the amount of parity data which is required for each page is 520 bits. As a result, one page size (total size of the data and the parity) becomes 4616 bits. In the embodiment, with respect to the page L, unless 40 bits are corrected as described in the related art, it is not possible to obtain the same error probability as the related art. Therefore the required amount of the parity data is 520 bits.

The virtual page UM' may have 4/3 times correcting capability in order to have the same error probability as the page L. The reason why the correcting capacity is 4/3 times will be described below. In the virtual page UM', the error may be caused by both the movement of the threshold voltage distribution in the page U and the movement of the threshold voltage distribution in the page M. Therefore, the error probability of the virtual page UM' is the total error probability of both pages U and M. As illustrated in FIG. 2, in the page U, the number of locations where a data error by the movement to the adjacent distribution occurs is two (boundaries #3 and #7) and also in the page M, the number of locations where a data error by the movement to the adjacent distribution occurs is two (boundaries #1 and #5) and thus the total is four locations. In contrast, in the page L, since there are three locations (#2, #4, and #6), a ratio of the error probability of the virtual page UM' is 4/3 times the error probability of page L. Therefore, the amount of parity data for the page UM' is 694 bits.

Figure 9:
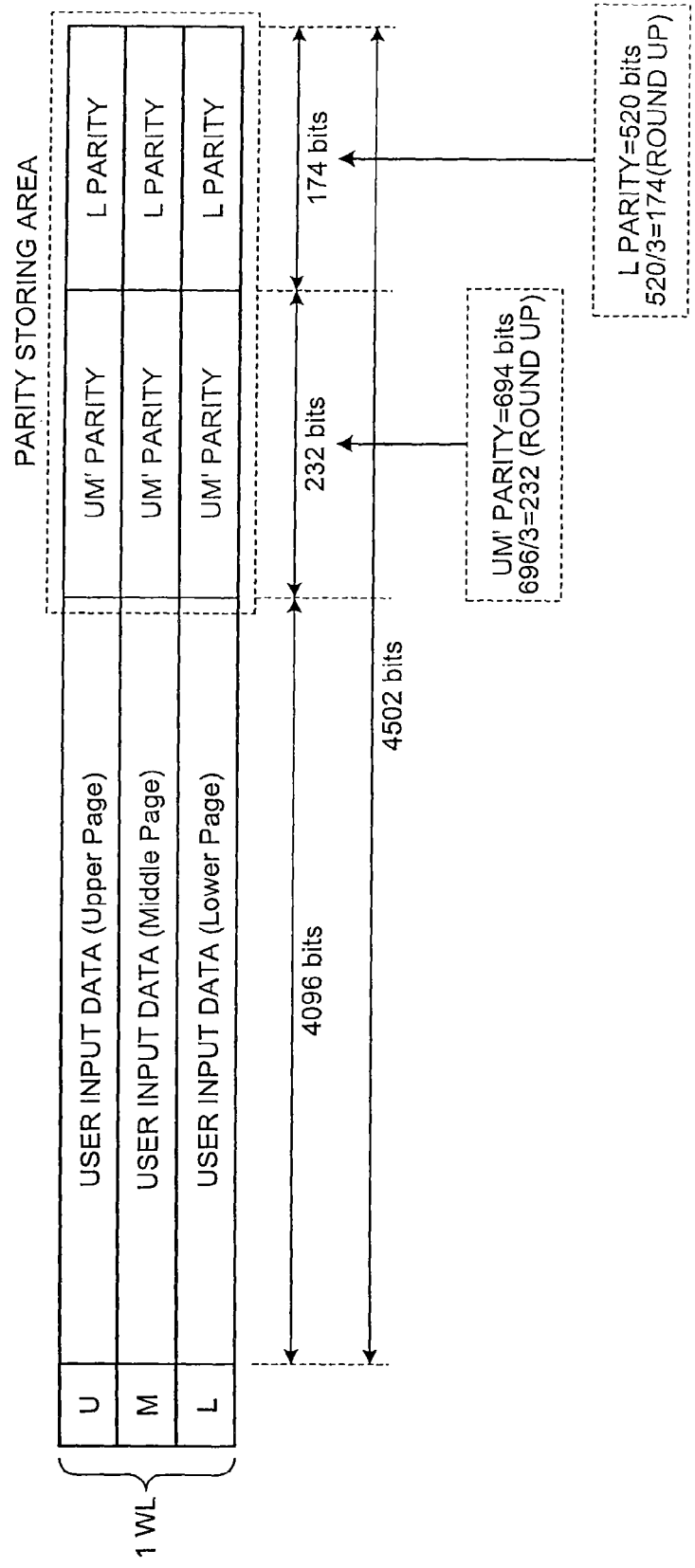
FIG. 9 is a diagram illustrating an example of positions where data and a parity are stored in a NAND flash memory according to the first embodiment.

FIG. 9 is a diagram illustrating an example of positions where data and a parity are stored in the NAND flash memory 2 according to the embodiment. FIG. 9 illustrates a position where data is stored in the memory cell having three page addresses that share one word line of the NAND flash memory 2. Even though it is described that a predetermined size of data to be subjected to error correction encoding is 4096 bits, the predetermined size of data to be subjected to the correction encoding is not limited thereto.

In the embodiment, since the parity is generated for the amount of data as much as two pages, the parity data is stored so as to be divided in the parity storing areas in three page addresses. In FIG. 9, both the parity of the virtual page UM' (UM' parity) and the parity of the page L (L parity) are divided into three so as to be divided into three pages, but is not limited thereto and may be distributed in any way. The amount of parity data is 520 bits in the page L and 694 bits in the virtual page UM'. However, the amount of parity data is not limited thereto.

Since the amount of parity data of the page L and the virtual page UM' is not divided into three, the amount of parity data is rounded to an integer. In the example of FIG. 9, the amount of parity data in one page is 4096 bit and the size of one page (an amount of one page of data and parity data) is 4502 bits. Therefore, the amount data is reduced as compared with 4616 bits which is one page size when 520 bits of parity is added to every page. Here, an example that the amount of parity data is reduced is illustrated. However, if 520 bits for every page, that is, total 1560 bits of parity data which is the same as in the related art is secured, the error correcting capability may be increased, which becomes an advantage of improving the error probability.

At the time of the read operation from the NAND flash memory 2, write data (data of pages U, M, and L) and a corresponding parity are simultaneously read. However, in the embodiment, the parity is for data of two pages, that is, the virtual page UM' and the page L. The error correcting process may be performed for the page L as it is, but in the pages U and M, the virtual page UM' is created similarly to the write operation. Therefore, after performing the error correcting process for the virtual page UM', the virtual page UM' is restored to pages U and M.

In order to create the virtual page UM' using the data of the page L as represented in Equation (1), it is assumed that the data of L is correct. Therefore, according to the procedure, the error correcting process for the page L is performed first, and then the virtual page UM' is created. Thereafter, the error correcting process for the virtual page UM' is performed.

Here, a rule for restoring the data of the pages U and M from the data of the virtual page UM' is represented by the following Equation (2). Further, the restored data of the page U is UA[i] and the restored data of the page M is MA[i]. The order is reverse to the order at the time of wiring operation. Data other than the correcting target is not restored from the virtual page UM', but data (U[i] and M[i] at the left side of Equation (2) read from the NAND flash memory 2.

$UA[i]=UM'[i]$ (if $L[i]=0$)

$U[i]$ (otherwise)

$MA[i]=UM'[i]$ (if $L[i]=1$)

$M[i]$ (otherwise) \hfill (2)

As a new advantage of the embodiment, it is expected that the error correction probability is improved by correcting errors of two pages U and M altogether as compared with the related art that separately corrects errors for all three pages. This is because if an error probability of any one of pages U and M is lower than the other, the correcting capability may be distributed in order to correct the error of the other page.

Figure 10:
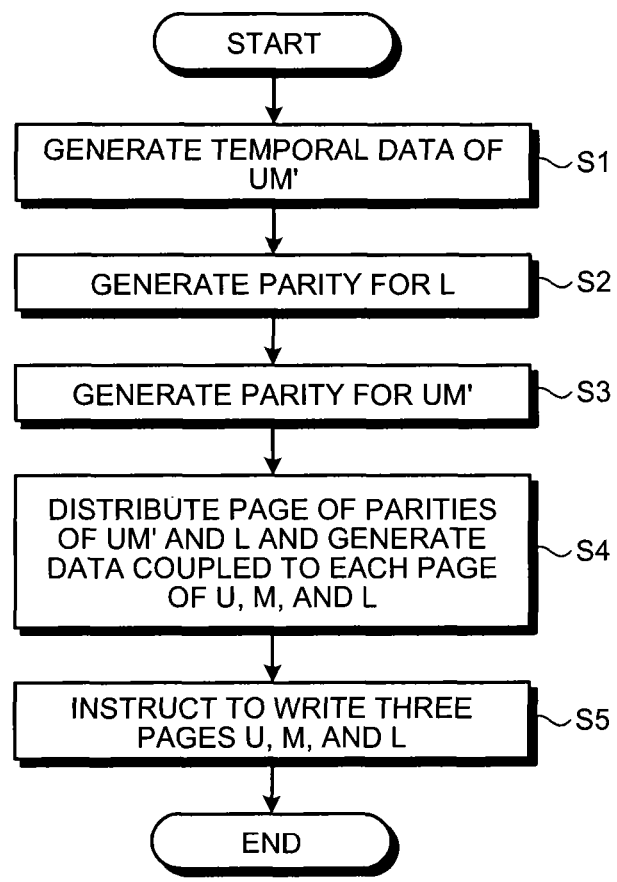
FIG. 10 is a flow chart illustrating an example of a write procedure into a NAND flash memory according to the first embodiment.

FIG. 10 is a flow chart illustrating an example of a write procedure into a NAND flash memory 2 according to the first embodiment. First, the processor 12 of the memory controller 1 generates data of the virtual page UM' (temporal data of UM') based on the data of three pages U, M, and L which are written into the same word line and stores the data in the RAM 11 (step S1). The processor 12 instructs the ECC circuit 14 to generate a parity for the page L (step S2). In accordance with the instruction, the ECC circuit 14 generates the parity for the data of the page L stored in the RAM 11.

Next, the processor 12 instructs the ECC circuit 14 to generate a parity based on the temporal data of UM' (step S3). In accordance with the instruction, the ECC circuit 14 generates the parity for the temporal data of the UM' stored in the RAM 11.

The processor 12 distributes the parities of the page UM' and the page L into three pages of parity storing addresses and generates data obtained by coupling the data of the pages U, M, and L with the distributed parities on the RAM 11 (step S4). Thereafter, the processor 12 instructs the memory interface 15 to write data for the three pages U, M, and L (including the parities) (step S5).

Figure 11:
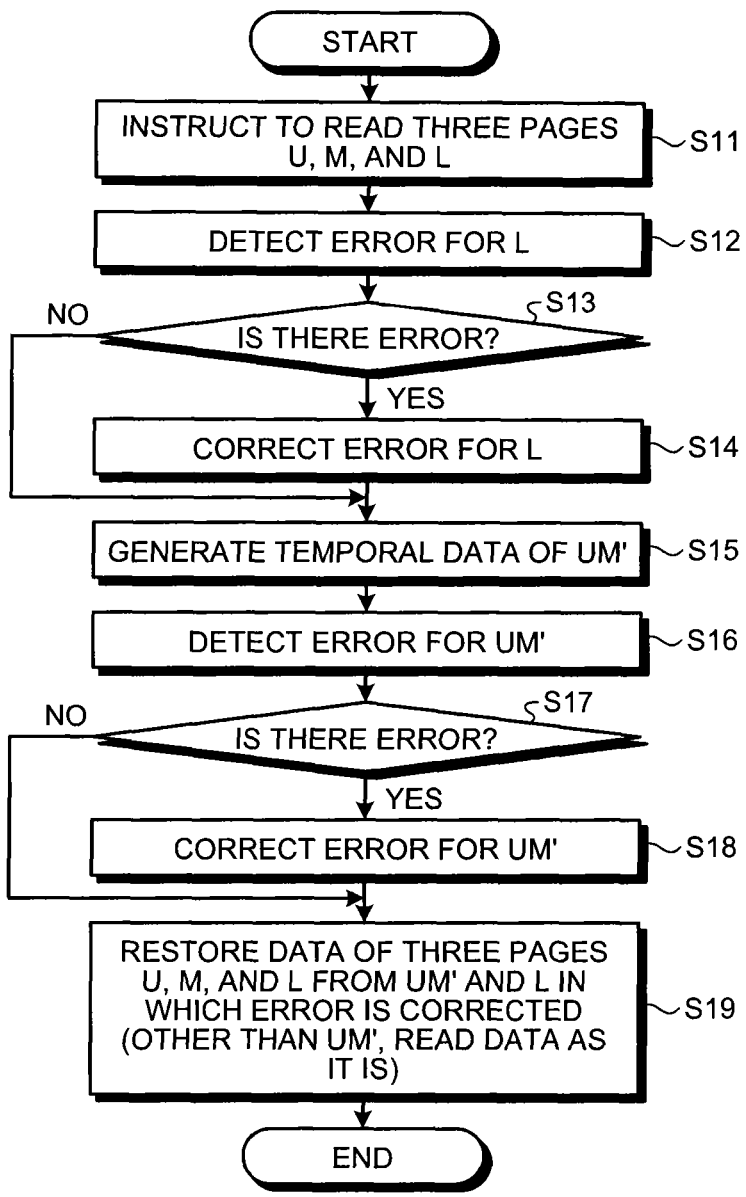
FIG. 11 is a flow chart illustrating an example of a read procedure from a NAND flash memory according to the first embodiment.

FIG. 11 is a flow chart illustrating an example of a read procedure from the NAND flash memory 2 according to the first embodiment. First, the processor 12 of the memory controller 1 instructs the memory interface 15 to read page data of the read target from the NAND memory 2 (step S11). In this case, all data and parities for three pages U, M, and L stored in the selective word line into which the reading target data is stored are read. However, if only the page L is read, it is not necessary to read the data for three pages, but similarly to the related art, page data of the page L (including L parity) may be read to correct the error similarly to the related art.

Next, the processor 12 transmits the page data and the parity of the page L to the ECC circuit 14 and instructs the ECC circuit 14 to detect an error for the data of the page L (step S12). The ECC circuit 14 detects the error of the data of the page L based on the instruction.

The processor 12 obtains the error detecting result from the ECC circuit 14 and determines whether there is an error (step S13). If there is an error (Yes in step S13), the processor 12 instructs the ECC circuit 14 to correct the error of the data of the page L (step S14). The ECC circuit 14 performs the data inversion for all error bits to correct the error based on the instruction.

The processor 12 generates the temporal data of UM' based on the data of the pages U, M, and L (step S15) and inputs the temporal data of UM' and the read parity of UM' to the ECC circuit 14 to instruct to detect the error (step S16). The ECC circuit 14 detects the error of the temporal data of UM' based on the instruction.

The processor 12 obtains the error detecting result of the temporal data of UM' from the ECC circuit 14 and determines whether there is an error (step S17). If there is an error (Yes in step S17), the processor 12 instructs the ECC circuit 14 to correct the error of the temporal data of UM' (step S18). The ECC circuit 14 performs the data inversion for all error bits to correct the error based on the instruction.

Next, the processor 12 restores data for three pages U, M, and L based on the temporal data of UM' and data of the page L in which the error is corrected (in case of a bit which does not have an error, reading data as it is) (step S19). Further, with respect to the page, the page L in which the error is corrected becomes data of the restored page as it is.

In step S13, if there is no error in the data of the page L (No in step S13), step S14 is not performed, but the sequence proceeds to step S15. Further, in step S17, if there is no error in the temporal data of UM' (No in step S17), step S18 is not performed, but the sequence proceeds to step S19.

As described above, according to the embodiment, between data of two pages, data having a higher error probability is extracted to create data for one virtual page and a parity for the data for the one virtual page. Therefore, as compared when a parity is added to each of the pages, the error correcting code (parity) may be efficiently used and error correcting capability may be improved without increasing the amount of parity data. Further, if the error correcting capability does not need to be improved, the amount of the parity data may be reduced so that the amount of memory cells of the NAND flash memory 2 that stores the parity data or the size of the ECC circuit 14 may be reduced, which reduces the cost.

In the embodiment, in the example of 2-2-3 division data allocation illustrated in FIG. 2, data of the virtual page is generated by the value of the data of L of which boundary number is 3 in accordance with Equation (1). Without being limited thereto, as long as the distribution of the data boundary numbers to the three pages is 2, 2, and 3, any data allocation may be applied. For example, 3-2-2 division in the order of U, M, and L may be obtained.

The reason is because in the gray code, the boundary position allocation of two pages of which boundary number is two and one page of which boundary number is three are uniquely determined, and this method depends only on the boundary position regardless of whether data is "1" or "0". Accordingly, among the boundary position allocation which is uniquely determined, there is a difference in which page of the pages U, M, and L being a page of which boundary number is 3. Therefore, by the data of the page whose boundary number is three, temporal data for data of two pages whose boundary number is two may be generated. For example, in the case of 3-2-2 division, data for one virtual page may be generated depending on a value of the page U of which boundary number is three based on the pages M and L.

(Second Embodiment)

Next, a semiconductor memory system according to a second embodiment will be described. The configuration of the semiconductor memory system according to the embodiment is the same as that of the first embodiment. Hereinafter, different parts from the first embodiment will be described.

In the first embodiment, only error caused by the movement to the adjacent threshold voltage distribution is corrected. However, a significant error such as movement to non-adjacent threshold voltage distribution (movement to two levels or more) may be actually generated at a slight probability. In the embodiment, a method that has the advantages of the first embodiment and can also correct an error other than the movement to the adjacent threshold voltage distribution will be described.

FIG. 12 is a diagram illustrating an example of a method of selecting data which is an error correcting target of the embodiment according to the second embodiment. In FIG. 12, the data allocation illustrated in FIG. 2 is assumed. The difference from the first embodiment is that a virtual page is generated by data excluded from the error correcting target and a parity is added to data of the virtual page. In the embodiment, a virtual page U' is generated by the same method as the method for the virtual page UM' of the first embodiment. Further, in the embodiment, a virtual page M' is generated using data which is not included in the virtual page U' among data of the pages U and M.

In other words, the virtual page U' is configured by data illustrated by a broken line of FIG. 12 and the virtual page M' is configured by the remaining data illustrated by one-dotted line. Since the virtual page M' is configured by data which becomes an error when the more significant error than the movement to the adjacent threshold voltage distribution occurs in one memory cell, the probability of error in the data of the virtual page M' is significantly lower than that in the data of the virtual page U'. Therefore, the error correcting capability for the virtual page M' does not need to be high and the amount of parity data may be small.

A rule for generating temporal data U'[i] and M'[i] corresponding to the virtual pages U' and M' is represented by the following Equation (3).

$$U'[i]=U[i] \text{ (if } L[i]=0)$$

$$M[i] \text{ (otherwise)}$$

$$M'[i]=U[i] \text{ (if } L[i]=1)$$

$$M[i] \text{ (otherwise)} \qquad (3)$$

At the time of write operation into the NAND flash memory 2, the temporal data is generated in accordance with Equation (3) and parities are imparted to data for three pages of virtual pages U' and M' and the page L.

Figure 13:
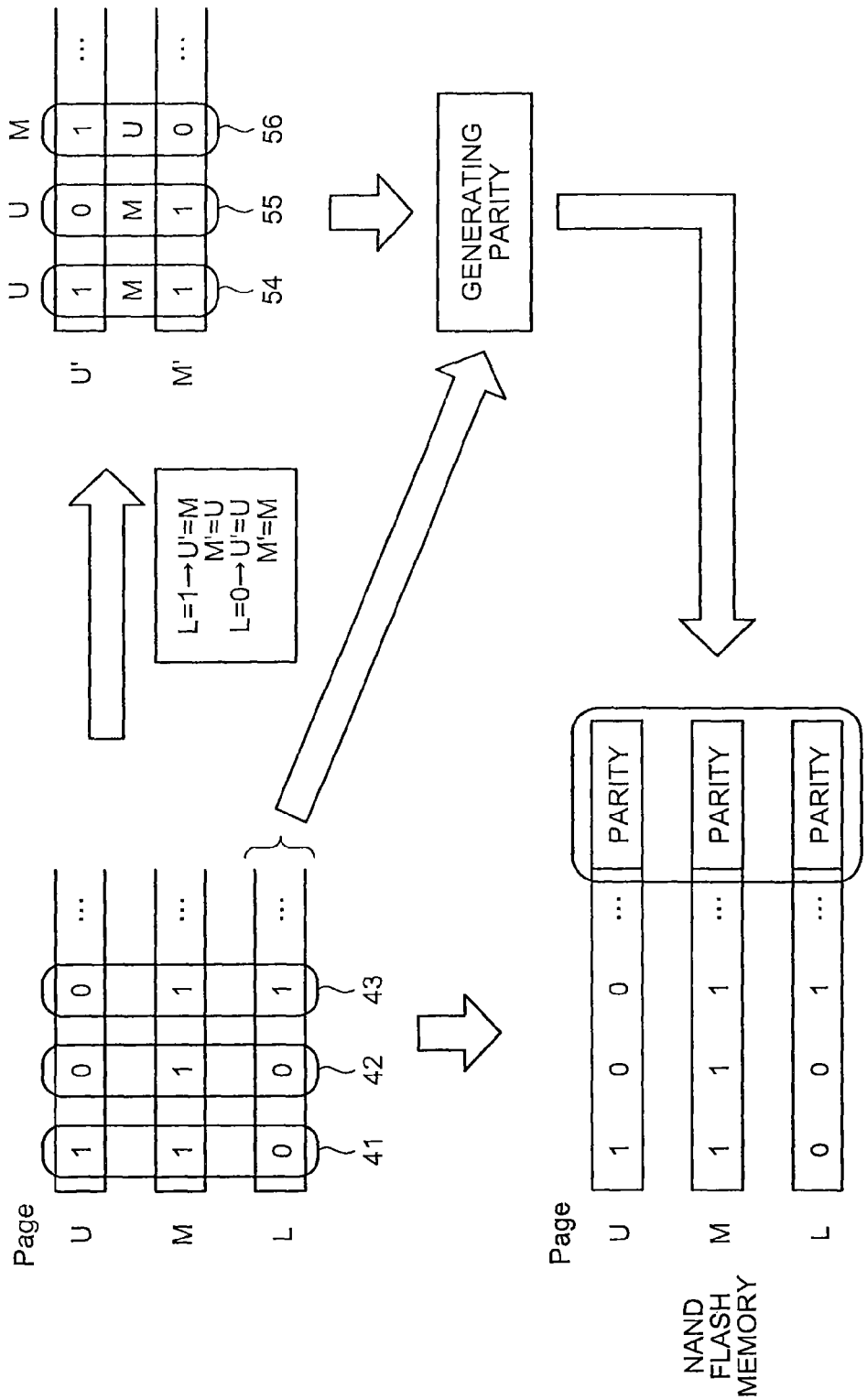
FIG. 13 is a diagram illustrating an example of a procedure of generating virtual pages U' and M' and a procedure of generating a parity.

FIG. 13 is a diagram illustrating an example of a procedure of generating virtual pages U' and M' and a procedure of generating a parity. The drawing at the upper left of FIG. 13 illustrates a state in which the processor 12 allocates the data transmitted from the host into the pages. Data 41, 42, and 43 is 3-bit data which is stored in one memory cell. Data 54, 55, and 56 is data of the virtual pages U' and M' which is generated based on the data 41, 42, and 43. When U'[i] and M'[i] are extracted in accordance with the above-mentioned Equation (3), it may be illustrated in the drawing at the upper right side of FIG. 8. Here, for example, the number (i) indicating the data 41, 42, and 43 is 1, 2, and 3. The data 41 becomes U'[1]=U[1]=1 and M'[1]=M[1]=1 in accordance with Equation (3) because the data value of the page L is "0". The data 43 becomes U'[3]=M[3]=1 and M'[1]=U[1]=0 in accordance with Equation (3) because the data value of the page L is "1".

The parity is generated based on the data of the virtual pages U' and M' and the data of the page L, and as illustrated in the lower left drawing of FIG. 13, data of the pages U, M, and L and the parities are written.

At the time of the read operation from the NAND flash memory 2, similarly as in the first embodiment, an error of the page L may be corrected using the parity as it is. With respect to the pages U and M, the virtual pages U' and M' (temporal data corresponding to the virtual pages U' and M') are generated and the parities are used for every page to correct the error. Thereafter, the data of the pages U and M is restored. In order to create temporal data corresponding to the virtual pages U' and M', it is assumed that the data of the page L is correct. Therefore, according to the procedure, after correcting the page L, the virtual pages U' and M' are generated. Then, the errors of the virtual pages U' and M' are corrected and the pages U and L are restored.

A rule for restoring data of the pages U and M from the temporal data of the virtual pages U' and M' is represented by the following Equation (4).

$$U[i]=U'[i] \text{ (if } L[i]=0\text{)}$$

$$M'[i] \text{ (otherwise)}$$

$$M[i]=U'[i] \text{ (if } L[i]=1\text{)}$$

$$M'[i] \text{ (otherwise)} \quad (4)$$

Next, a numerical example of the amount of data will be described. Like the numerical example of the first embodiment, if the amount of user data for one page is 4096 bits and the ECC circuit 14 by the BCH method that is capable of correcting 40 bits thereof is used, the amount of parity data is 520 bits.

In the embodiment, in order to correct 40 bits for the page L, the amount of the parity data becomes 520 bits which is same as the first embodiment. With respect to the virtual page U', in order to correct 40 bits for each of the pages U and M, the amount of the parity data becomes 694 bits which is the same as the virtual page UM' of the first embodiment. With respect to an error which is incorrect at two level or more, if up to four memory cells may be corrected, the amount of parity data for the virtual page M' is 104 bits (2 pages×4 bits×13; 13=12+1; 4096=$2^{12}$).

Figure 14:
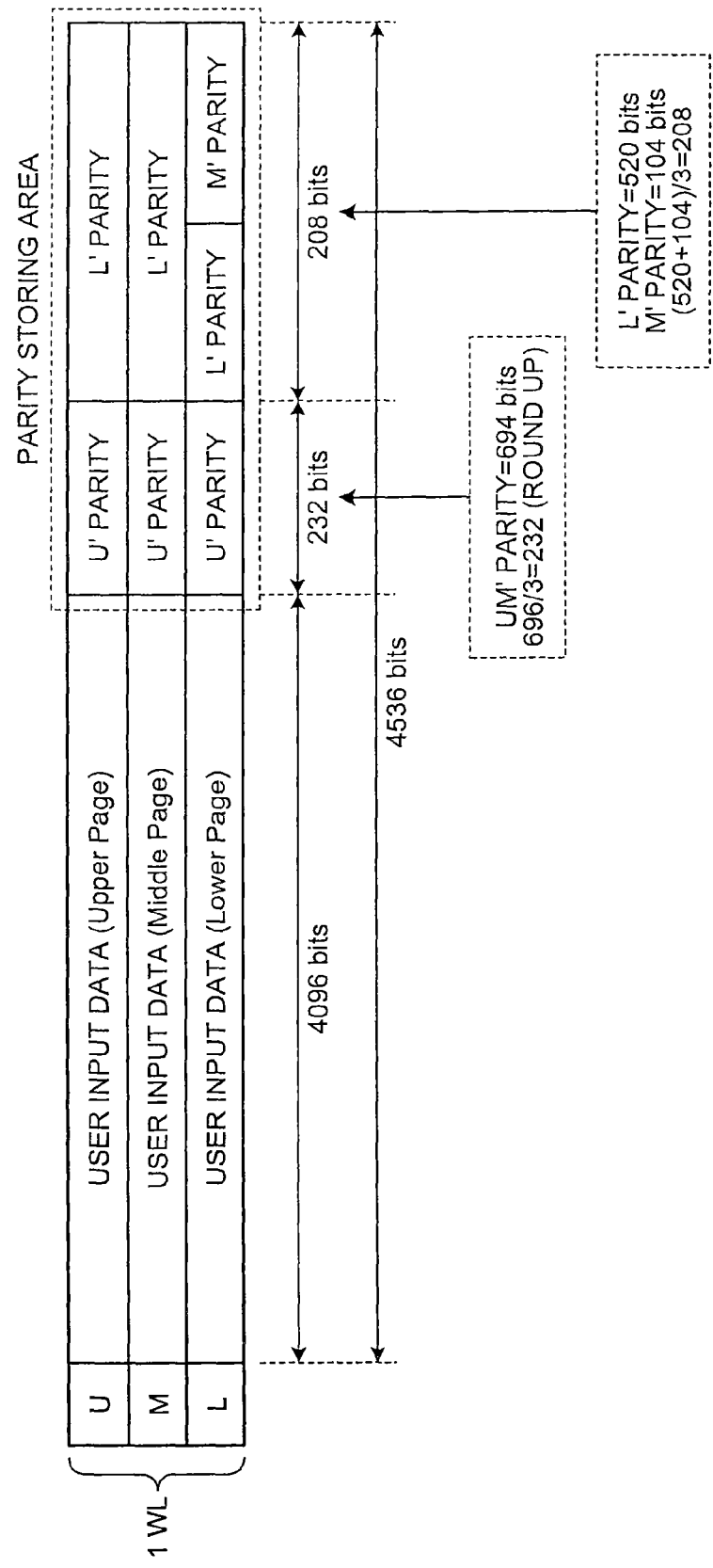
FIG. 14 is a diagram illustrating an example of positions where data and a parity are stored in a NAND flash memory according to the second embodiment.

FIG. 14 is a diagram illustrating an example of positions where data and a parity are stored in the NAND flash memory 2 according to the second embodiment. FIG. 14 illustrates a position where data is stored in the memory cell having three page addresses that share one word line of the NAND flash memory 2. Even though it is described that a predetermined size of data to be subjected to error correction encoding target is 4096 bits, the predetermined size of data to be subjected to the error correction encoding is not limited thereto.

In the embodiment, since the parity data is generated for the amount of data as much as three pages, a data size of the parity for the data of the page M' (M' parity) is smaller than those of the U' parity and the L parity. Therefore, here, the U' parity and the L parity are stored so as to be distributed into parity storing areas in three page addresses, and the M' parity is stored in one page address. The advantage is the same even though any distribution method is used to distribute the parities into the parity storing areas of the pages.

Since the amount of parity data is not divided into three, the amount of parity data is rounded to an integer. In the example, the amount of parity data in one page is 440 bits and the size of one page is 4536 bits. Therefore, according to the embodiment, the amount of parity data and the size of one page are increased as much as the error correcting capability is further improved than the first embodiment but the amount of data is reduced as compared with 4616 bits of the related art.

Figure 15:
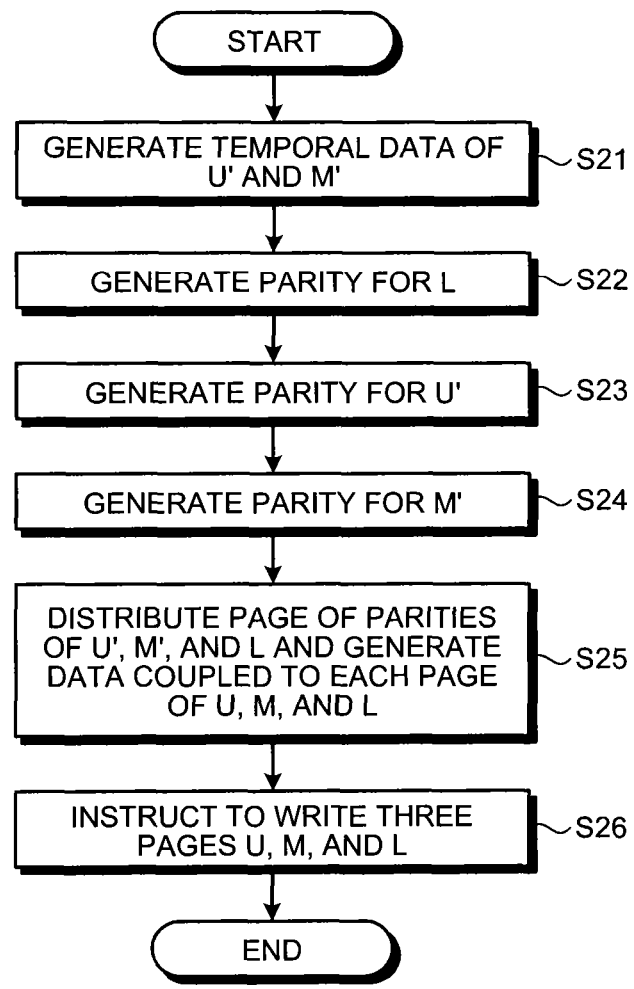
FIG. 15 is a flow chart illustrating an example of a write procedure into the NAND flash memory according to the second embodiment.

FIG. 15 is a flow chart illustrating an example of a write procedure into the NAND flash memory 2 according to the second embodiment. First, the processor 12 of the memory controller 1 generates data of the virtual pages U' and M' (temporal data of the virtual pages U' and M') based on the data of three pages U, M, and L which are written into the same word line and stores the data in the RAM 11 (step S21). The processor 12 instructs the ECC circuit 14 to generate a parity for the page L (step S22). In accordance with the instruction, the ECC circuit 14 generates the parity for the data of the page L stored in the RAM 11.

Next, the processor 12 instructs the ECC circuit 14 to generate a parity based on the temporal data of virtual page U' (step S23). In accordance with the instruction, the ECC circuit 14 generates the parity for the temporal data of U' stored in the RAM 11.

Next, the processor 12 instructs the ECC circuit 14 to generate a parity based on the temporal data of the virtual page M' (step S24). In accordance with the instruction, the ECC circuit 14 generates the parity for the temporal data of M' stored in the RAM 11. The order of the steps S23 and S24 may be reversed.

The processor 12 distributes the parities of the virtual pages U' and M' and the page L into three pages of parity storing addresses and generates data obtained by coupling the data of the pages U, M, and L with the distributed parities on the RAM 11 (step S25). Thereafter, the processor 12 instructs the memory interface 15 to write data for the three pages U, M, and L (including the parities) (step S26).

Figure 16:
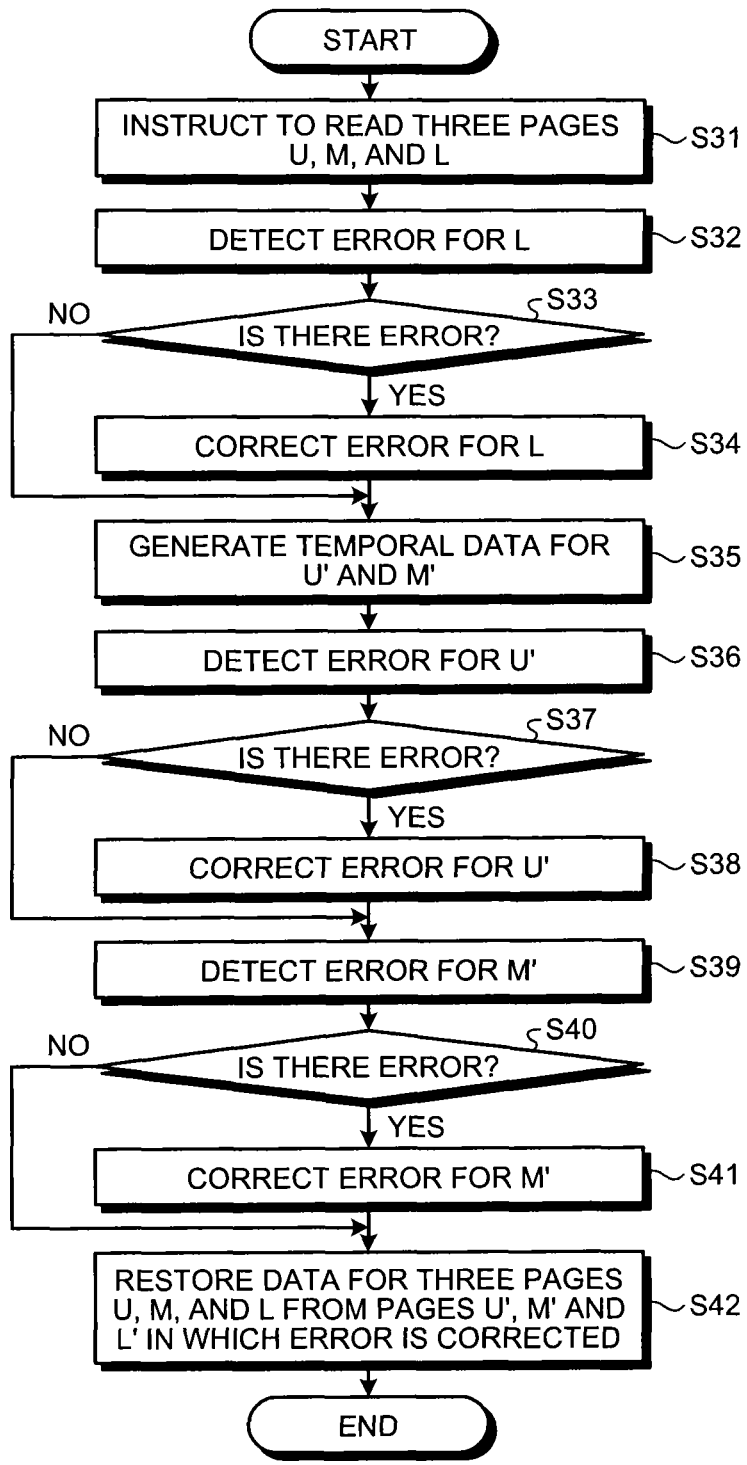
FIG. 16 is a flow chart illustrating an example of a read procedure from the NAND flash memory according to the second embodiment.

FIG. 16 is a flow chart illustrating an example of a read procedure from the NAND flash memory 2 according to the second embodiment. First, the processor 12 of the memory controller 1 instructs the memory interface 15 to read page data which is the read target from the NAND memory 2 (step S31). In this case, all data and parities for three pages U, M, and L stored in the selective word line into which the read target data is stored are read.

Next, the processor 12 transmits the page data and the parity of the page L to the ECC circuit 14 and instructs the ECC circuit 14 to detect an error for the data of the page L (step S32). The ECC circuit 14 detects the error of the data of the page L based on the instruction.

The processor 12 obtains the error detecting result from the ECC circuit 14 and determines whether there is an error (step S33). If there is an error (Yes in step S33), the processor 12 instructs the ECC circuit 14 to correct the error of the data of the page L (step S34). The ECC circuit 14 performs the data inversion for all error bits to correct the error based on the instruction.

The processor 12 generates the temporal data of U' and M' based on the data of the pages U, M, and L (step S35) and inputs the temporal data of U' and the read U' parity to the ECC circuit 14 to instruct to detect the error (step S36). The ECC circuit 14 detects the error of the temporal data of U' based on the instruction.

The processor 12 obtains the error detecting result of the temporal data of U' from the ECC circuit 14 and determines whether there is an error (step S37). If there is an error (Yes in step S37), the processor 12 instructs the ECC circuit 14 to correct the error of the temporal data of U' (step S38). The ECC circuit 14 performs the data inversion for all error bits to correct the error based on the instruction.

Next, the processor 12 inputs the temporal data of M' and the read M' parity to the ECC circuit 14 and instructs the ECC circuit 14 to detect an error (step S39). The ECC circuit 14 detects the error of the temporal data of M' based on the instruction.

The processor 12 obtains the error detecting result of the temporal data of M' from the ECC circuit 14 and determines whether there is an error (step S40). If there is an error (Yes in step S40), the processor 12 instructs the ECC circuit 14 to correct the error of the temporal data of M' (step S41). The ECC circuit 14 performs the data inversion for all error bits to correct the error based on the instruction.

Next, the processor 12 restores data for three pages U, M, and L based on the temporal data of U' and M' and data of the page L in which an error is corrected (in case of a bit which does not have an error, read data as it is) (step S42).

In step S33, if there is no error in the data of the page L (No in step S33), step S34 is not performed, but the sequence proceeds to step S35. Further, in step S37, if there is no error in the temporal data of U' (No in step S37), step S38 is not performed, but the sequence proceeds to step S39. In step S40, if there is no error in the temporal data of M' (No in step S40), step S41 is not performed, but the sequence proceeds to step S42.

In this embodiment, similarly to the first embodiment, the virtual page U' is generated by data having a higher error probability between the pages U and M to generate the parity for the virtual page. Further, in this embodiment, another virtual page M' is configured by data which does not configure the virtual page U' between the pages U and M, and a parity having a lower error correcting capability than that of the virtual page U' with respect to the virtual page M' is generated. Therefore, the same advantage as the first embodiment is achieved and a 2 bits or higher error in the memory cell in which the threshold voltage of the memory cell is moved to next two neighbors or the threshold voltage of the memory cell is significantly moved by the over program can be corrected.

(Third Embodiment)

Next, a semiconductor memory system according to a third embodiment will be described. The configuration of the semiconductor memory system according to the embodiment is the same as that in the first embodiment. Hereinafter, different parts from the first embodiment will be described.

Figure 17:
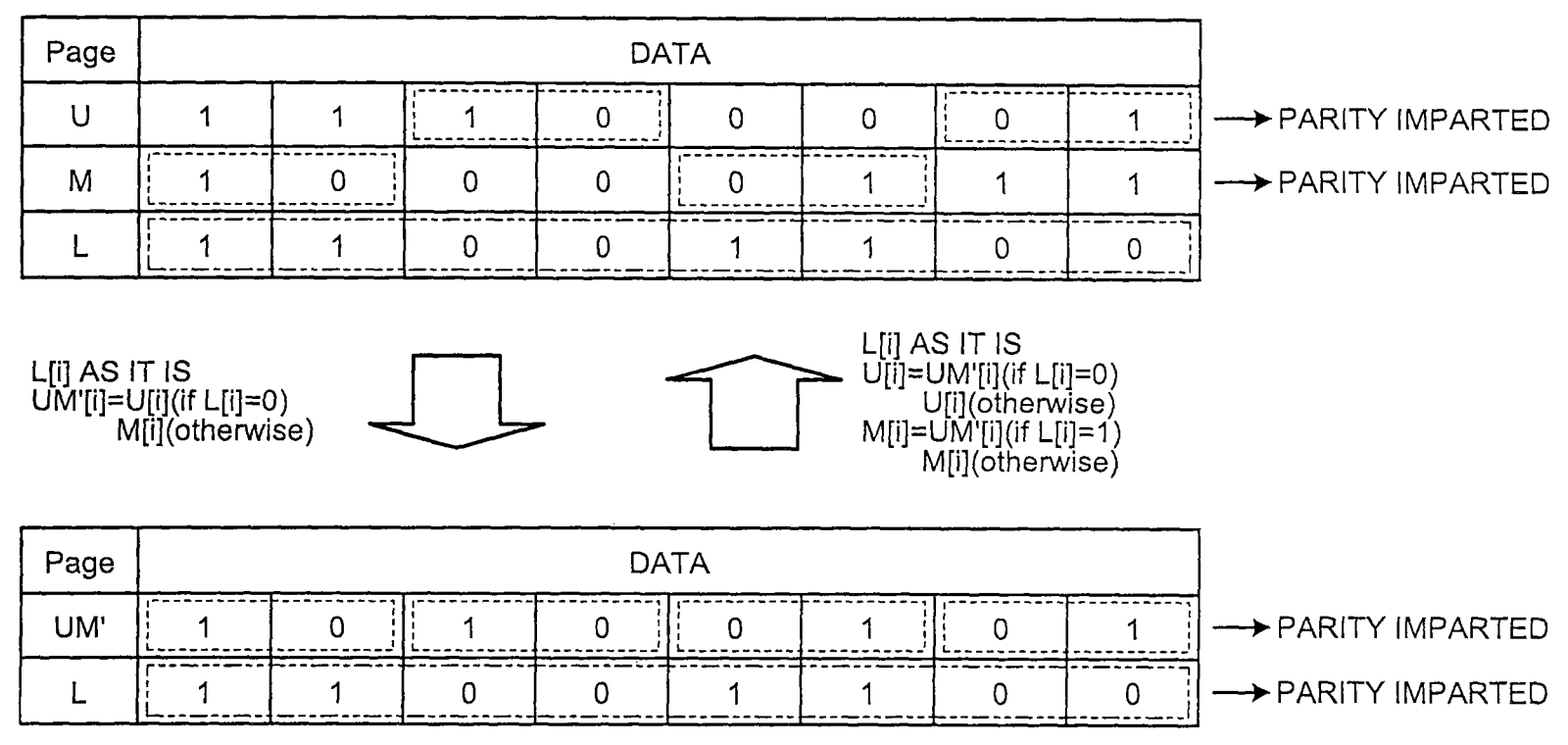

FIG. 17 is a diagram illustrating an example of a method of selecting data which is an error correcting target the embodiment according to the third embodiment. In FIG. 17, the data allocation illustrated in FIG. 2 is assumed. The method of generating the virtual page UM' and the method of generating the parity for the virtual page UM' are the same as those of the first embodiment. The difference from the first embodiment is that a parity is added to data of each of the pages U and M.

As mentioned in the second embodiment, a significant error such as movement to non-adjacent threshold voltage distribution (movement to two levels or more) may occur at a slight probability. In the embodiment, in order to achieve the advantages of the first embodiment and correct errors other than the movement to the adjacent threshold voltage distribution, the parities are added to the data of the pages U and M. However, since the correction of the error corresponding to the adjacent threshold voltage distribution is performed using the parity of the page UM', the parities of the pages U and M do not need to have high error correcting capability and the amount of parity data may be small.

At the time of the read operation from the NAND flash memory 2, similarly to the first embodiment, first, the error of the page L is corrected. Next, the virtual page UM' is generated and the error of the page UM' is corrected to restore the pages U and M. Thereafter, the errors for the pages U and M are corrected.

Next, a numerical example of the data amount will be described. Like the numerical example of the first embodiment, if the amount of user data for one page is 4096 bits and the ECC circuit 14 by the BCH method capable of correcting 40 bits thereof is used, the amount of parity data is 520 bits.

In the embodiment, in order to correct 40 bits for the page L, the amount of the parity data becomes 520 bits which is the same as the first embodiment. Further, in order to correct 40 bits for each of the pages U and M, similarly to the first embodiment, the amount of the parity data of the page UM' becomes 694 bits. With respect to the pages U and M, in order to correct up to four cells which is incorrect at two level or more, the amount of parity data for the pages U and M is 52 bits (4 bits×13; 13=12+1; 4096=$2^{12}$), respectively.

Figure 18:
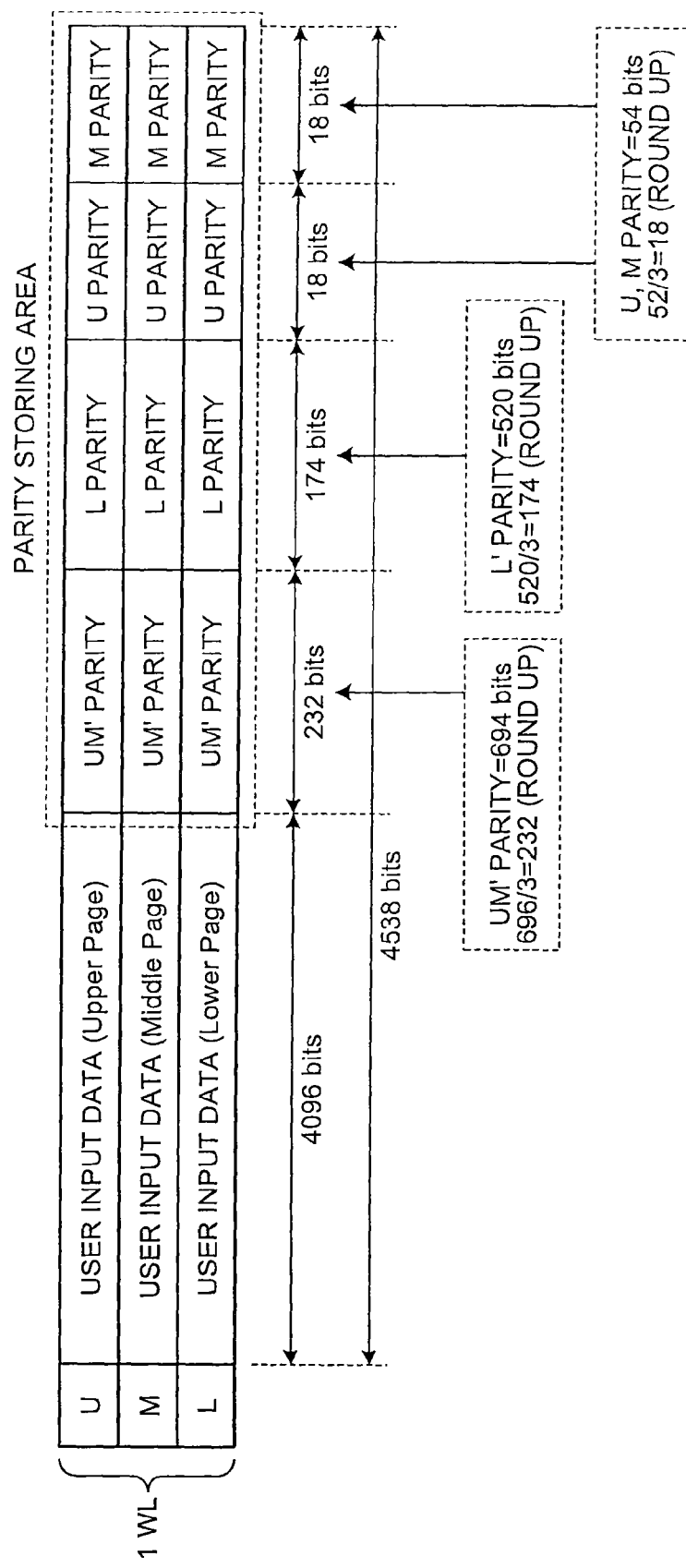
FIG. 18 is a diagram illustrating an example of positions where data and a parity are stored in a NAND flash memory according to the third embodiment.

FIG. 18 is a diagram illustrating an example of positions where data and a parity are stored in the NAND flash memory 2 according to the third embodiment. FIG. 18 illustrates a data storing position into the memory cell having three page addresses that share one word line of the NAND flash memory 2. Even though it is described that a predetermined size of data to be subjected to error correction encoding is 4096 bits, the predetermined size of data to be subjected to the error correction encoding is not limited thereto.

In the embodiment, even though the parity data is generated for the amount of data as much as four pages, data sizes of the parity for the data of the page U (U parity) and the parity for the data of the page M (M parity) are smaller than those of the UM' parity and the L parity. Therefore, here, all the UM' parity, the L parity, the U parity, and the M parity are stored so as to be distributed into parity storing areas in three page addresses. The advantage is the same even though any distribution method is used to distribute the parities into the parity storing areas of the pages.

Since the amount of the above-mentioned parity data is not divided into three, the amount of parity data is rounded to an integer. In this embodiment, the amount of parity data of one page is 440 bits and the size of one page is 4538 bits. Therefore, according to the embodiment, the page size is further increased than the first embodiment as much as the improved error correcting capability but the amount of data is reduced as compared with 4616 bits of the related art.

Figure 19:
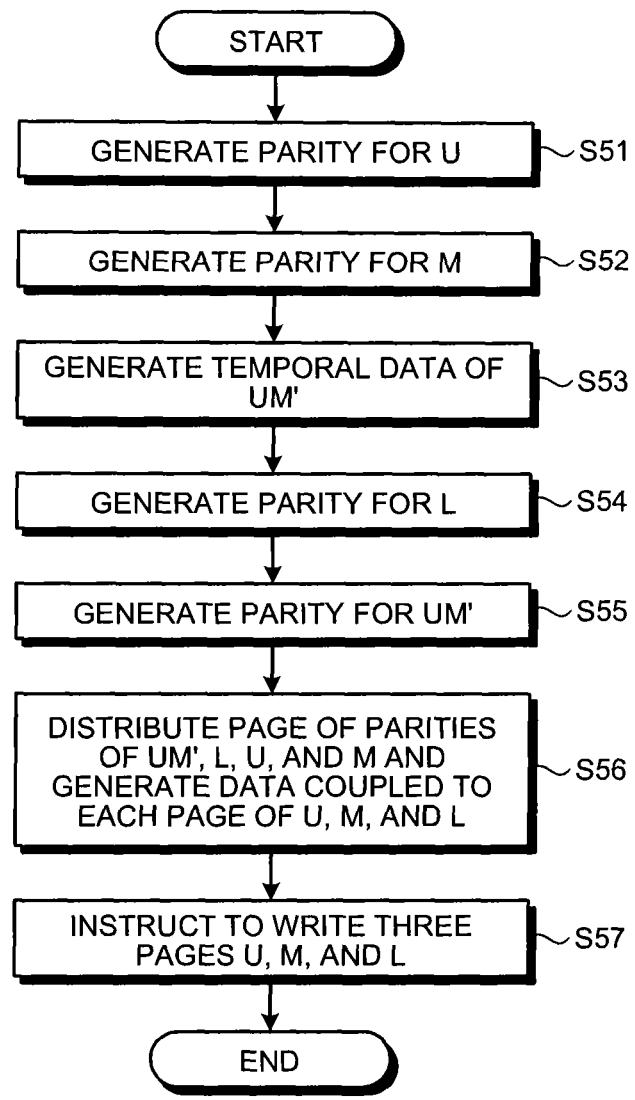
FIG. 19 is a flow chart illustrating an example of a write procedure into the NAND flash memory according to the third embodiment.

FIG. 19 is a flow chart illustrating an example of a write procedure into a NAND flash memory 2 according to the third embodiment. First, the processor 12 of the memory controller 1 instructs to generate a parity of data of the page U among the pages U, M, and L which are written into the same word line (step S51). In accordance with the instruction, the ECC circuit 14 generates the parity for the data of the page U.

Next, the processor 12 instructs to generate a parity for the data of the page M (step S52). In accordance with the instruction, the ECC circuit 14 generates the parity for the data of the page M.

Then, the processor 12 generates data of the virtual page UM' (temporal data of the virtual page UM') based on the data of three pages U, M, and L which are written into the same word line and stores the data in the RAM 11 (step S53). Then, the processor 12 instructs the ECC circuit 14 to generate a parity for the page L (step S54). In accordance with the instruction, the ECC circuit 14 generates the parity for the data of the page L stored in the RAM 11. Further, the processor 12 instructs the ECC circuit 14 to generate a parity for the virtual page UM' (step S55). In accordance with the instruction, the ECC circuit 14 generates the parity for the data of the virtual page UM' stored in the RAM 11.

The processor 12 distributes the parities of the virtual page UM' and the pages U, M, and L into three pages of parity storing addresses and generates data obtained by coupling the data of the pages U, M, and L with the distributed parities on the RAM 11 (step S56). Thereafter, the processor 12 instructs the memory interface 15 to write data for the three pages U, M, and L (including the parities) (step S57).

Figure 20:
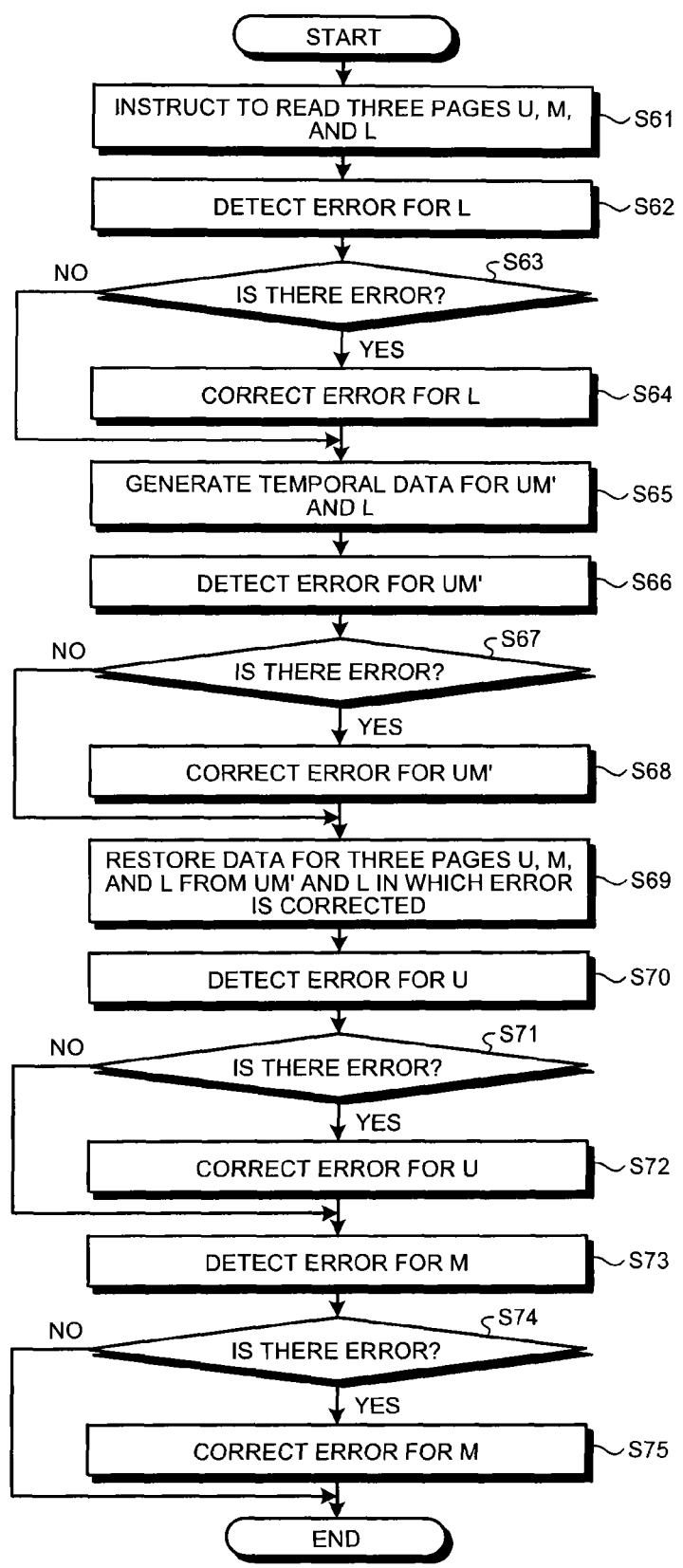
FIG. 20 is a flow chart illustrating an example of a read procedure from the NAND flash memory according to the third embodiment.

FIG. 20 is a flow chart illustrating an example of a read procedure from the NAND flash memory 2 according to the third embodiment. First, the processor 12 of the memory controller 1 instructs the memory interface 15 to read page data of the reading target from the NAND memory 2 (step S61). In this case, all data and parities for three pages U, M, and L stored in the selective word line into which the read target data is stored are read.

Next, the processor 12 transmits the page data and the parity of the page L to the ECC circuit 14 and instructs the ECC circuit 14 to detect an error for the data of the page L (step S62). The ECC circuit 14 detects the error of the data of the page L based on the instruction.

The processor 12 obtains the error detecting result from the ECC circuit 14 and determines whether there is an error (step S63). If there is an error (Yes in step S63), the processor 12 instructs the ECC circuit 14 to correct the error of the data of the page L (step S64). The ECC circuit 14 performs the data inversion for all error bits to correct the error based on the instruction.

The processor 12 generates the temporal data of UM' based on the data of the pages U, M, and L (step S65) and inputs the generated temporal data of UM' and the read UM' parity to the ECC circuit 14 to instruct to detect the error (step S66). The ECC circuit 14 detects the error of the temporal data of UM' based on the instruction.

The processor 12 obtains the error detecting result of the temporal data of UM' from the ECC circuit 14 and determines whether there is an error (step S67). If there is an error (Yes in step S67), the processor 12 instructs the ECC circuit 14 to correct the error of the temporal data of UM' (step S68). The ECC circuit 14 performs the data inversion for all error bits to correct the error based on the instruction.

Next, the processor 12 restores the data of the page U and the data of the page M using the data of page L in which the error is corrected and the data of the page UM' in which the error is corrected (step S69). Here, the data of the pages U and M to be restored is data in which the error is corrected by the UM' parity (that is, data in which the error of the movement to the adjacent threshold voltage distribution is corrected).

The processor 12 inputs the data of the restored page U and the read U parity to the ECC circuit 14 and instructs the ECC circuit 14 to detect an error (step S70). The ECC circuit 14 detects the error of the restored page U.

The processor 12 obtains the error detecting result of the restored page U from the ECC circuit 14 and determines whether there is an error (step S71). If there is an error (Yes in step S71), the processor 12 instructs the ECC circuit 14 to correct the error of the restored page U (step S72). The ECC circuit 14 performs the data inversion for all error bits to correct the error based on the instruction.

Then, the processor 12 inputs the data of the restored page M and the read U parity to the ECC circuit 14 and instructs the ECC circuit 14 to detect an error (step S73). The processor 12 obtains the error detecting result of the restored page M from the ECC circuit 14 and determines whether there is an error (step S74). If there is an error (Yes in step S74), the processor 12 instructs the ECC circuit 14 to correct the error of the restored page M (step S75). The ECC circuit 14 performs the data inversion for all error bits to correct the error based on the instruction.

In step S63, if there is no error in the data of the page L (No in step S63), step S64 is not performed, but the sequence proceeds to step S65. Further, in step S67, if there is no error in the temporal data of UM' (No in step S67), step S68 is not performed, but the sequence proceeds to step S69. In step S71, if there is no error in the restored page U (No in step S71), step S72 is not performed, but the sequence proceeds to step S73. In step S74, if there is no error in the restored page M (No in step S74), step S75 is not performed.

In this embodiment, similarly to the first embodiment, the virtual page UM' is generated by data having a higher error probability between the pages U and M to generate the parity for the virtual page. Further, in this embodiment, with respect to the pages U and M, a parity having lower error correcting capability than the virtual page UM' is generated. Therefore, the same advantage as the first embodiment is achieved and a 2 bits or higher error in the memory cell such as when the memory threshold voltage moves next two distributions or the threshold voltage of the memory cell is significantly moved by the over program may also be corrected.

In the embodiment, the amount of parity data is increased as compared with the second embodiment. However, in the second embodiment, it is required to generate two pages of temporal data. However, the embodiment may generate only one page, which allows a working memory for storing the temporal data to be smaller.

(Fourth Embodiment)

Figure 21:
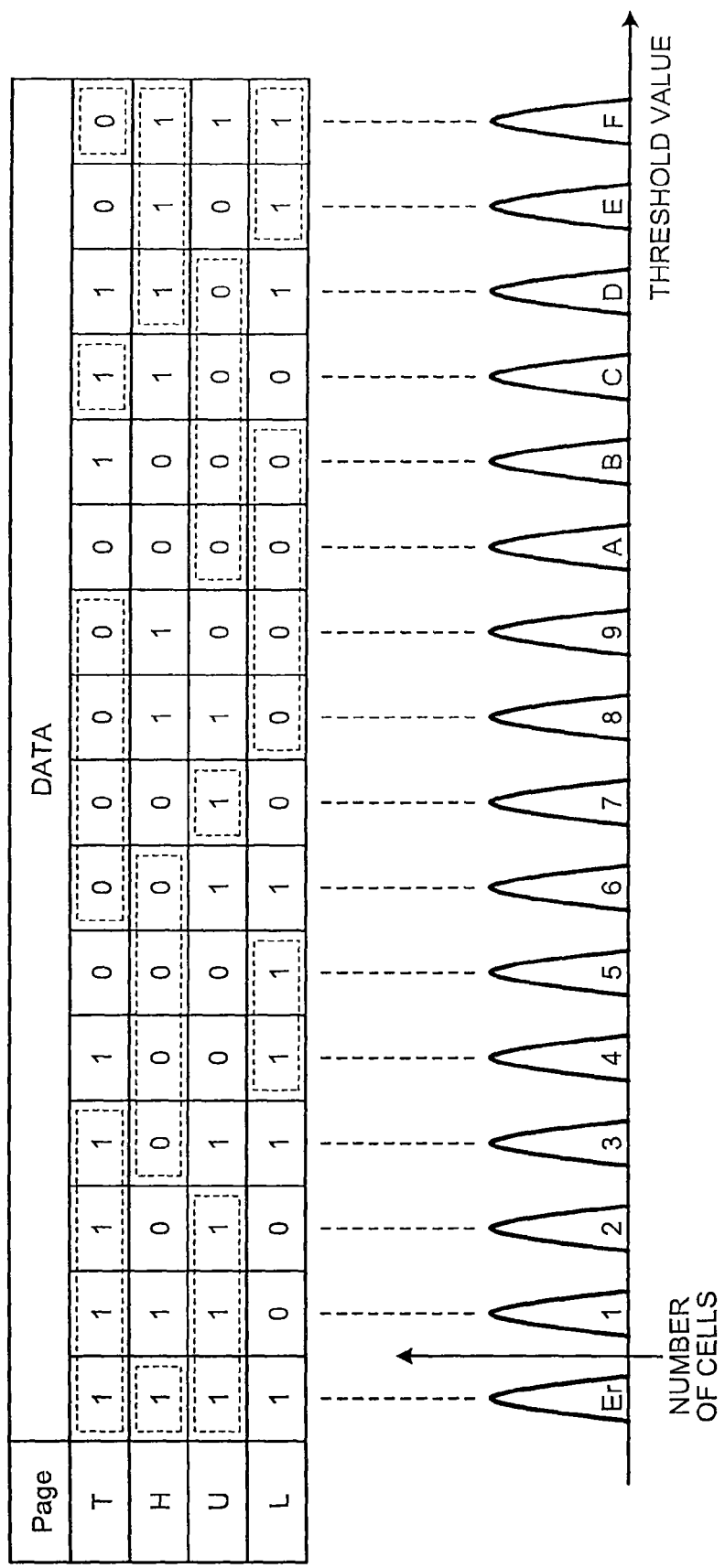
FIG. 21 is a diagram illustrating an example that allocates a threshold voltage of a memory cell into data according to a fourth embodiment.

FIG. 21 is a diagram illustrating an example that allocates a threshold voltage of a memory cell into data according to a fourth embodiment. The configuration of the semiconductor memory system according to the embodiment is the same as the first embodiment. Hereinafter, different parts from the first embodiment will be described.

In the embodiment, an example that 4 bits are stored in one memory cell will be described. In order to store 4 bits, 16 kinds of threshold voltage distribution are defined and data is allocated into each of the threshold voltage distribution as illustrated in FIG. 21. Also in the embodiment, data allocated into the adjacent threshold voltage distribution becomes a gray code of which data has one bit difference. Page addresses corresponding to 4 bits stored in one memory cell are referred to as T (top), H (higher), U (upper), and L (lower), respectively. In FIG. 21, a position where the data is not changed by the movement to the adjacent threshold voltage distributions at both sides is enclosed by the broken line.

Figure 22:
FIG. 22 is a diagram illustrating an example of a method of selecting data which is an error correcting target the embodiment according to the fourth embodiment.

FIG. 22 is a diagram illustrating an example of a method of selecting data which is an error correcting target according to the fourth embodiment. As described above, if the cause of the error is the movement to the adjacent threshold voltage distribution, an error does not occur in data which is not changed in adjacent threshold voltage distributions at both sides. When 3-bit data is stored in one memory cell (in case of 3 bits/cell), as illustrated in FIG. 7 of the first embodiment, the distribution position in which an error does not occur (positions of the pages U and M other than the broken line in the example of FIG. 7) does not overlap the distribution position between the pages. In case of 3 bits/cell, as illustrated in the first embodiment, it is possible to discriminate in which page an error easily occurs in the corresponding threshold voltage distribution by a value of data of the remaining one page (page L in the example of FIG. 7).

However, as illustrated in FIG. 21, if 4 bits of data is stored in one memory cell, in some cases, it is difficult to surely extract the distribution position where the error does not occur without being overlapped between the two pages or without omission. In case of focusing on two pages of four pages (pages A and B), if a threshold voltage distribution which is a position where the error does not occur in the page A is a position where the error occurs in the page B, and a threshold voltage distribution which is a position where the error does not occur in the page B is a position where the error occurs in the page A, similarly to the first embodiment, it is possible to extract data at the position where the error occurs from the pages A and B. However, as illustrated in FIG. 21, if the distribution positions where the error does not occur overlap between the two pages, it is difficult to generate a virtual page that extracts only data where the error occurs from the data in two pages.

Therefore, since the virtual page including only data where the error occurs by the movement to the adjacent threshold voltage distribution may be not generated in the embodiment, a virtual page including the data with an error that the threshold voltage distribution moves beyond two or more boundaries is generated. The virtual page is generated so as to make the latter (the data with the error that the threshold voltage distribution moves beyond two or more boundaries) be smaller. In the example of FIG. 22, the virtual page is configured by data of the pages H and U and the virtual page is referred to as a page U'. Further, a separate virtual page is configured by data that does not configure the page U' between the pages H and U and the separate virtual page is referred to as a virtual page H'. In the virtual page H', most of data has errors that the threshold voltage distributions move beyond two or more boundaries but a small amount of data has errors caused by the movement to the adjacent threshold voltage distribution. Parities of both the virtual pages H' and U' are generated. The error correcting capability may be higher in the virtual page U' and lower in the virtual page H'. Parities are generated to each of the pages T and L.

If temporal data that configures the virtual pages H' and U' is H'[i] and U'[i], a rule for generating H'[i] and U'[i] are represented by the following Equation (5).

$H'[i]=H[i]$ (if $L[i]=1$)

$U[i]$ (otherwise)

$U'[i]=H[i]$ (if $L[i]=0$)

$U[i]$ (otherwise)  (5)

In the example of FIG. 22, the position that configures the virtual page H' is enclosed by the broken line and the position that configures the virtual page U' is enclosed by the one-dotted line. As seen from FIG. 21, in the leftmost threshold voltage distribution Er, both the pages U and H are not data in which an error occurs by the movement to the adjacent threshold voltage distribution. However, as seen from the drawing at the upper side of FIG. 22, data corresponding to the threshold voltage distribution Er of the page U is allocated into the virtual page U'. As described above, the virtual page U' includes much data in which an error occurs by the movement of the adjacent threshold voltage distribution, but also includes data where the error does occur by the movement of the threshold voltage distribution.

Even though the virtual pages H' and U' are generated based on the value of L[i], as long as a method generates a virtual page including more data in which the error occurs by the movement to the adjacent threshold voltage distribution in the virtual page U' than in the virtual page H' between the virtual pages H' and U', the method is not limited to the generating method represented by Equation (5). For example, in contrast to the example of FIG. 22, as the data corresponding to the threshold voltage distribution Er, data of the page H may be allocated into the virtual page U' and data of the page U may be allocated into the virtual page H'. In this case, since the virtual pages U' and M' are not generated based on the value of the page L, the virtual pages U' and H' are generated using a correspondence table of the virtual pages U' and H' and the values of the data of the pages T, H, U, and L.

At the time of write operation into the NAND flash memory 2, in accordance with the rule of Equation (5), temporal data for two pages is generated. Parities are imparted to data for total four pages obtained by adding the remaining two pages. In Equation (5), an example that the virtual pages H' and U' using the data of the pages U and H are generated is described, but the virtual pages may be generated using the remaining two pages.

Figure 23:
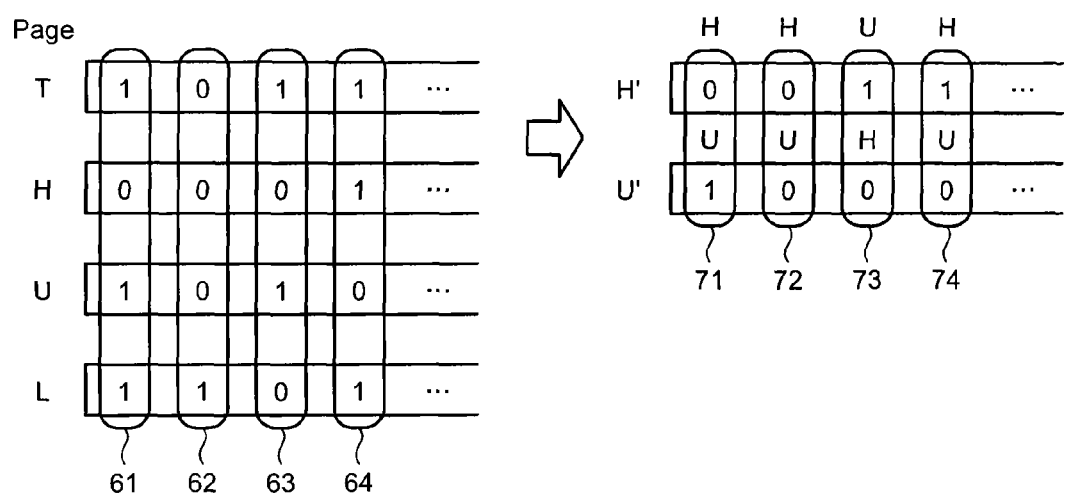
FIG. 23 is a diagram illustrating an example of a procedure of generating virtual pages H' and U'.

FIG. 23 is a diagram illustrating an example of a procedure of generating the virtual pages H' and U' of the embodiment. The drawing at the left side of FIG. 23 illustrates examples of data of the original pages T, H, U, and L and the drawing at the right side of FIG. 23 illustrates examples of data of the generated virtual pages H' and U'. Data 61, 62, 63, and 64 are four bits of data that are stored in one memory cell. Data 71, 72, 73, and 74 are data of the virtual pages H' and U' generated based on the data 61, 62, 63, and 64.

At the time of the read operation from the NAND flash memory 2, the errors of the pages T and L are corrected as they are. With respect to the pages H and U, temporal data which are H'[i] and U'[i] are created, the error is corrected for the created temporal data (virtual pages) and then the pages U and H are restored. Further, in order to create the temporal data which are H'[i] and U'[i], it is assumed that the data of the page L is correct. Therefore, according to procedures, first, the page L is corrected, H'[i] and U'[i] are generated, H'[i] and U'[i] are corrected, and then the pages H and U are restored.

A rule for restoring data (H[i] and U[i]) of the pages H and L from the temporal data H'[i] and U'[i] is in the reverse order to the writing order and is represented by the following Equation (6).

$H[i]=H'[i]$ (if $L[i]=1$)

$U[i]$ (otherwise)

$U[i]=H'[i]$ (if $L[i]=0$)

$U[i]$ (otherwise)  (6)

By using the above-described parity adding method, the amount of other parity data may be reduced even in 4 bits/cell.

FIG. 24 is a diagram illustrating an example of positions where data and a parity are stored in the NAND flash memory according to the fourth embodiment. In the example, the T parity, the H' parity, the U' parity, and the L parity are stored so as to be distributed into parity storing areas in four page addresses. Here, even though the T parity, the H' parity, the U' parity, and the L parity are equally divided into four so as to be distributed, the distributing method of the T parity, the H' parity, the U' parity, and the L parity into the parity storing areas is not limited thereto, and any distributing method may have the same advantages. The H' parity may reduce the amount of parity data as compared with other parities.

Figure 25:
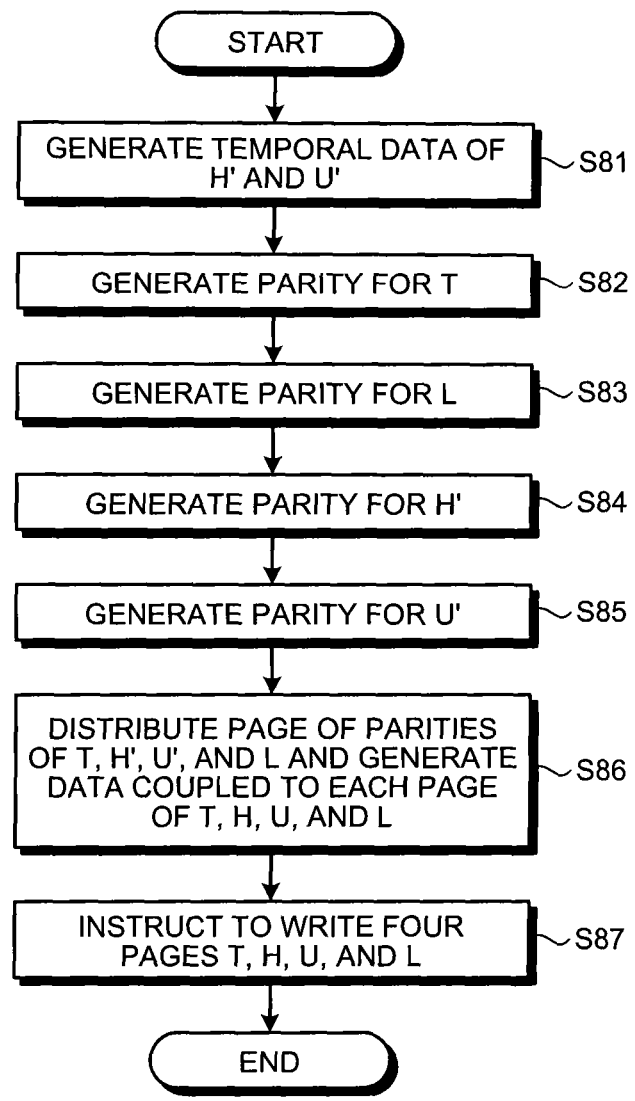
FIG. 25 is a flow chart illustrating an example of a write procedure into the NAND flash memory according to the fourth embodiment.

FIG. 25 is a flow chart illustrating an example of a write procedure into the NAND flash memory 2 according to the fourth embodiment. First, the processor 12 of the memory controller 1 generates temporal data of the virtual pages H' and U' based on the data of three pages H, U, and L which are written into the same word line and stores the temporal data in the RAM 11 (step S81). Even though four pages T, H, U, and L are written in the NAND flash memory 2, the page T is not used to generate the virtual pages H' and U' as represented in Equation (5).

The processor 12 instructs the ECC circuit 14 to generate a parity for the page T (step S82). In accordance with the instruction, the ECC circuit 14 generates the parity for the data of the page T stored in the RAM 11. The processor 12 instructs the ECC circuit 14 to generate a parity for the page L (step S83). In accordance with the instruction, the ECC circuit 14 generates the parity for the data of the page L stored in the RAM 11.

Next, the processor 12 instructs the ECC circuit 14 to generate a parity based on the temporal data of the virtual page H' (step S84). In accordance with the instruction, the ECC circuit 14 generates the parity for the temporal data of H' stored in the RAM 11.

Next, the processor 12 instructs the ECC circuit 14 to generate a parity based on the temporal data of the virtual page U' (step S85). In accordance with the instruction, the ECC circuit 14 generates the parity for the temporal data of U' stored in the RAM 11.

The processor 12 distributes the parities of the virtual pages H' and U' and the pages T, and L into four pages of parity storing addresses and generates data obtained by coupling the data of the pages T, H, U, and L with the distributed parities on the RAM 11 (step S86). Thereafter, the processor 12 instructs the memory interface 15 to write data for the four pages T, H, U, and L (including the parities) (step S87).

Figure 26:
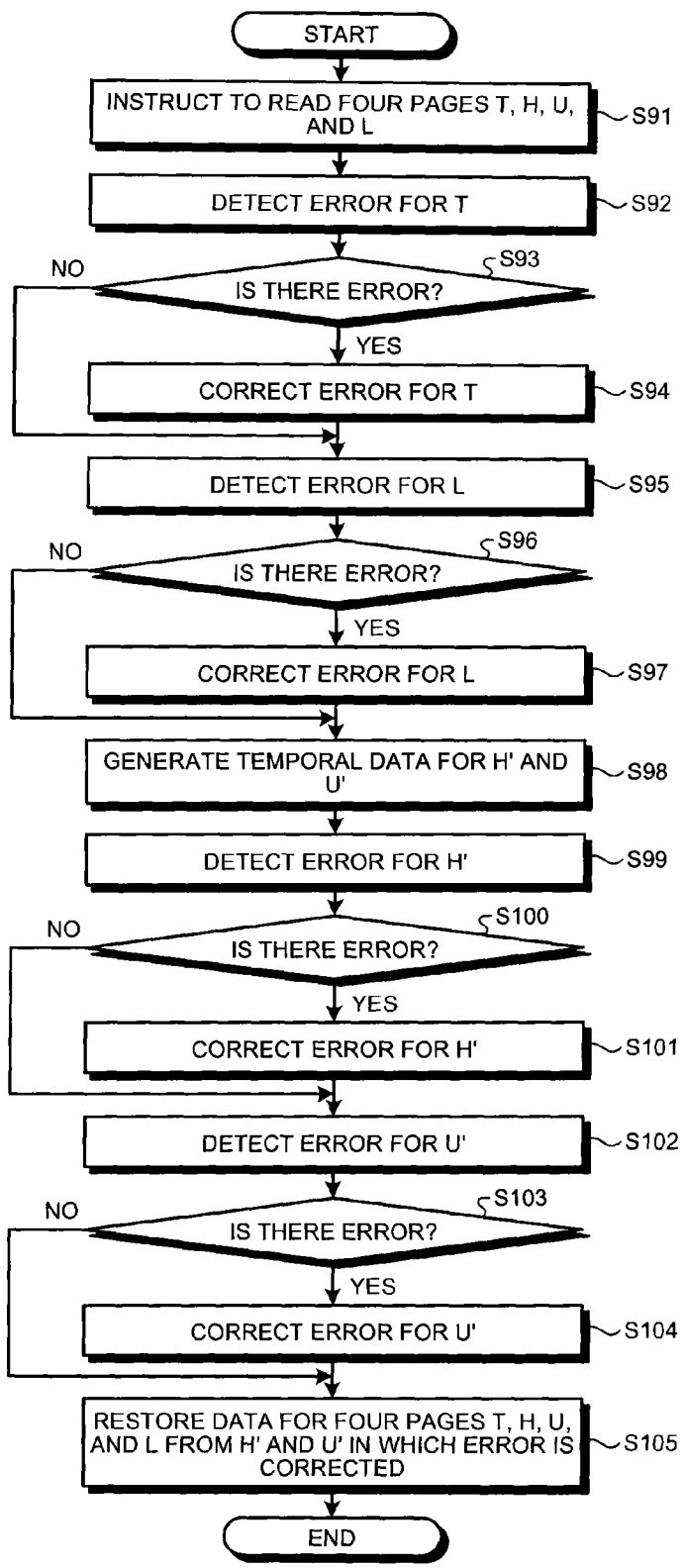
FIG. 26 is a flow chart illustrating an example of a read procedure from the NAND flash memory according to the fourth embodiment.

FIG. 26 is a flow chart illustrating an example of a read procedure from the NAND flash memory 2 according to the fourth embodiment. First, the processor 12 of the memory controller 1 instructs the memory interface 15 to read page data of the reading target from the NAND memory 2 (step S91). Further, the processor 12 also instructs the memory interface 15 to read all data and the parities for the four pages T, H, U, and L stored in the selective word line in which the reading target data is stored. However, when only the pages T and L are read, page data of the pages T and L (including the L parity and the T parity) may be read to correct the error, like the related art. Further, if only the page H, or only the page U, or the pages H and U are read, three pages H, U, and L are read.

Next, the processor 12 transmits the page data and the parity of the page T to the ECC circuit 14 and instructs the ECC circuit 14 to detect an error for the data of the page T (step S92). The ECC circuit 14 detects the error of the data of the page T based on the instruction.

The processor 12 obtains the error detecting result from the ECC circuit 14 and determines whether there is an error (step S93). If there is an error (Yes in step S93), the processor 12 instructs the ECC circuit 14 to correct the error of the data of the page T (step S94). The ECC circuit 14 performs the data inversion for all error bits to correct the error based on the instruction.

Next, the processor 12 transmits the page data and the parity of the page L to the ECC circuit 14 and instructs the ECC circuit 14 to detect an error for the data of the page L (step S95). The ECC circuit 14 detects the error of the data of the page L based on the instruction.

The processor 12 obtains the error detecting result from the ECC circuit 14 and determines whether there is an error (step S96). If there is an error (Yes in step S96), the processor 12 instructs the ECC circuit 14 to correct the error of the data of the page L (step S97). The ECC circuit 14 performs the data inversion for all error bits to correct the error based on the instruction.

The processor 12 generates the temporal data of H' and U' based on the data of the pages H, U, and L (step S98) and inputs the temporal data of H' and the read H' parity to the ECC circuit 14 to instruct to detect the error (step S99). The ECC circuit 14 detects the error of the temporal data of H' based on the instruction.

The processor 12 obtains the error detecting result of the temporal data of H' from the ECC circuit 14 and determines whether there is an error (step S100). If there is an error (Yes in step S100), the processor 12 instructs the ECC circuit 14 to correct the error of the temporal data of H' (step S101). The ECC circuit 14 performs the data inversion for all error bits to correct the error based on the instruction.

Next, the processor 12 inputs the temporal data of U' and the read U' parity to the ECC circuit 14 and instructs the ECC circuit 14 to detect an error (step S102). The ECC circuit 14 detects the error of the temporal data of U' based on the instruction.

The processor 12 obtains the error detecting result of the temporal data of U' from the ECC circuit 14 and determines whether there is an error (step S103). If there is an error (Yes in step S103), the processor 12 instructs the ECC circuit 14 to correct the error of the temporal data of U' (step S104). The ECC circuit 14 performs the data inversion for all error bits to correct the error based on the instruction.

Next, the processor 12 restores data for four pages T, H, U, and L based on the temporal data of H' and U' and data of the pages L and T in which the errors are corrected (in case of a bit which does not have an error, read data as it is) (step S105). However, since the pages T and L do not need to be restored, the data in which the errors are corrected becomes the restored data.

In step S93, if there is no error in the data of the page T (No in step S93), step S94 is not performed, but the sequence proceeds to step S95. In step S96, if there is no error in the data of L (No in step S96), step S97 is not performed, but the sequence proceeds to step S98. In step S100, if there is no error in the temporal data of H' (No in step S100), step S101 is not performed, but the sequence proceeds to step S102. In step S103, if there is no error in the data of U' (No in step S103), the sequence of step S104 is not performed, but the sequence proceeds to step S105.

As described above, in the embodiment, when 4 bits of data is stored in one memory cell, from data for two pages, a virtual page having a higher error probability and a virtual page having a lower error probability are generated and the parities are added to the virtual pages. Therefore, the amount of the parity data of the virtual page having the lower error probability may become smaller and thus the parity storing areas are efficiently used. Therefore, it is possible to improve the error correcting capability without increasing the amount of parity data.

In the first to fourth embodiments, even though a virtual page having a higher error probability is generated from the data for two pages, a virtual page having a higher error probability may be generated from the data for three pages or more. In this case, the parity is added only to the virtual page having a higher error probability similarly to the first embodiment or a parity having a lower correcting capability is further added to the original page similarly to the second embodiment. Further, one or more virtual pages having a lower error probability may be generated and the parity having the lower correcting capability may be added to the virtual page having the lower error probability.

(Fifth Embodiment)

In the above embodiments, the example of the semiconductor memory system in which the memory controller 1 includes an ECC circuit 14 is described. However, there is a NAND flash memory including an ECC circuit installed therein.

Figure 27:
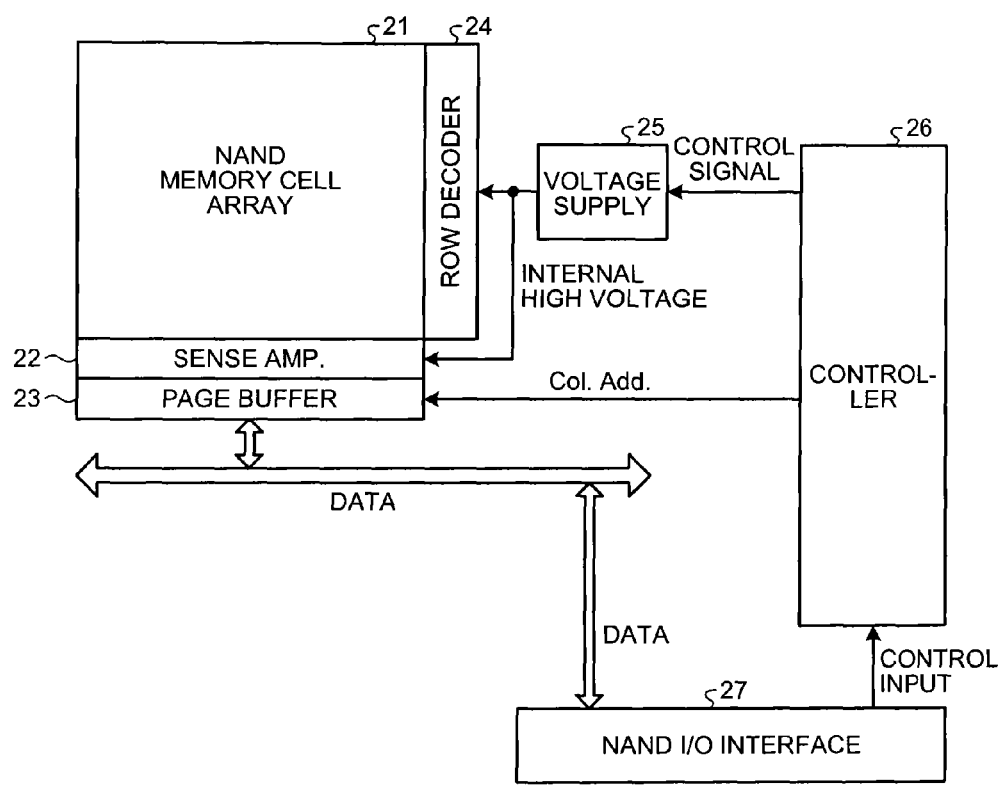
FIG. 27 is a diagram illustrating an example of a NAND flash memory without an ECC circuit.

FIG. 27 is a diagram illustrating an example of a NAND flash memory without an ECC circuit. As illustrated in FIG. 27, the NAND flash memory includes a NAND memory cell array 21, a sense Amp. (amplifier) 22, a page buffer 23, a row decoder 24, a voltage supply 25, a controller 26, and a NAND I/O (input/output) interface 27. In the first to fourth embodiments, it is assumed to use the NAND flash memory that does not include the ECC circuit. FIG. 27 illustrates an example of a general configuration, but the invention is not limited to the configuration of FIG. 27. The operations of the parts are the same as the related art and the detailed description thereof will be omitted.

Figure 28:
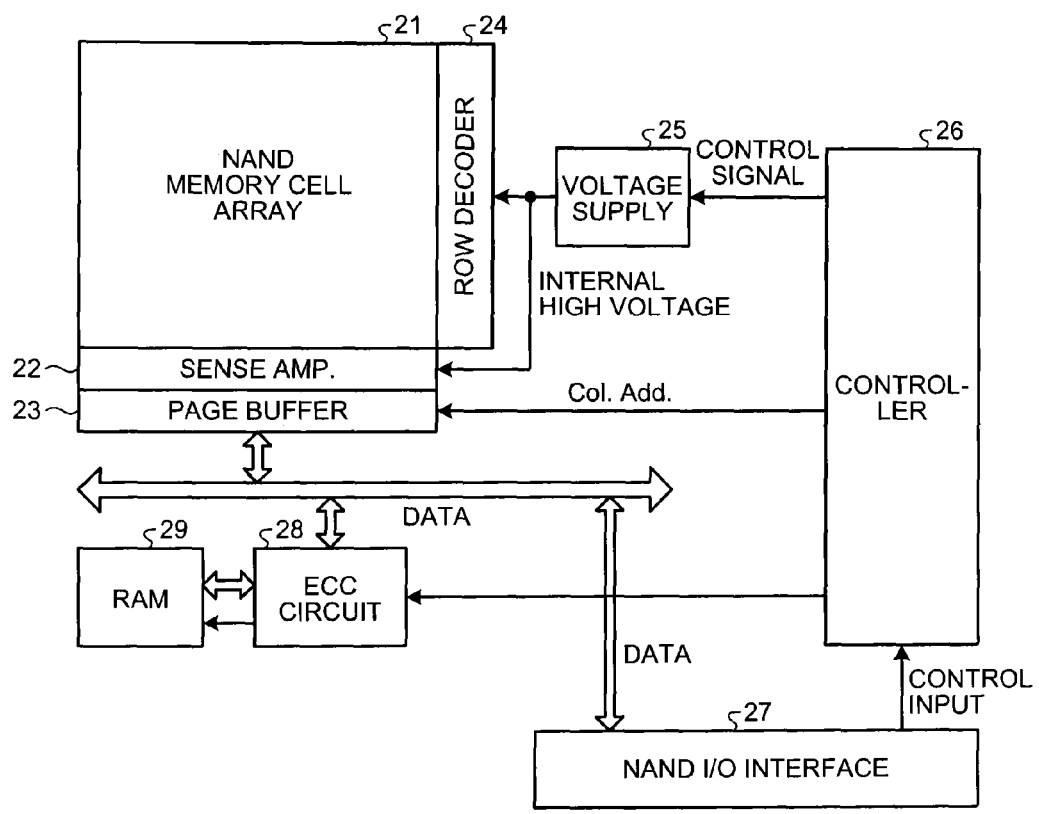
FIG. 28 is a diagram illustrating an example of a NAND flash memory having an ECC circuit installed therein.

FIG. 28 is a diagram illustrating an example of a NAND flash memory having an ECC circuit installed therein. In the example of FIG. 28, an ECC circuit 28 and a RAM 29 are added to the configuration example of FIG. 25. FIG. 28 illustrates an example of a general configuration. As long as the ECC circuit 28 is provided, the configuration thereof is not limited to the configuration of FIG. 28.

If the NAND flash memory illustrated in FIG. 28 is used, the operation of the ECC circuit 14 of the above-mentioned NAND controller is performed by the ECC circuit 28 installed in the NAND flash memory. The operation of the processor that generates the virtual pages as mentioned in the first to fourth embodiments may be performed by a processor installed in the memory controller that is connected to the NAND flash memory or by the controller 26 in the NAND flash memory.

As described above, the first to fourth embodiments may be applied to a semiconductor memory system having various configurations and there is no limitation on the semiconductor memory system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller that controls a non-volatile semiconductor memory including a memory cell of 3 bits/cell in which each of a plurality of 3-bit values is allocated to each of a plurality of threshold voltage distributions, a first bit represents a first page bit, a second bit represents a second page bit, and a third bit represents a third page bit, the memory controller comprising:
   upon writing data for three pages of the first page, the second page, and the third page to a first memory area of the non-volatile semiconductor memory, a control unit that selects one bit, from the first page bit and the second page bit, which becomes an error bit when a threshold voltage distribution moved to an adjacent threshold voltage distribution owing to charge leakage or flow, and generates a virtual page using the selected bits from the first page and the second page;
   an encoding unit that generates a first error correcting code for the virtual page; and
   an interface unit that writes the data for the three pages and the first error correcting code in the non-volatile semiconductor memory.

2. A memory controller that controls a non-volatile semiconductor memory including a memory cell of 3 bits/cell in which each of a plurality of 3-bit values is allocated to each of a plurality of threshold voltage distributions, a first bit represents a first page bit, a second bit represents a second page bit, and a third bit represents a third page bit, wherein the allocation of the three bits of data into each of the threshold voltage distribution is a gray code, a number of boundaries of a first page and a second page of the gray code are two and a number of boundaries of the third page is three, the memory controller comprising:
   upon writing data for three pages of the first page, the second page, and the third page to the first memory area of the non-volatile semiconductor memory, a control unit that selects the first page bit when the third page bit is 1 and selects the second page bit when the third page bits is 0,and generates a virtual page using the selected bits from the first page and the second page;
   an encoding unit that generates a first error correcting code for the virtual page; and
   an interface unit that writes the data for three pages and the first error correcting code in the non-volatile semiconductor memory.

3. The memory controller according to claim 1, further comprising:
   an error correcting unit that corrects an error based on the data read from the non-volatile semiconductor memory and the error correcting code,
   wherein the interface unit reads the data for three pages and the first error correcting code from the non-volatile semiconductor memory, and
   the control unit generates the virtual page from the read data for three pages and the error correcting unit corrects an error for the virtual page based on the first error correcting code.

4. The memory controller according to claim 1, wherein the encoding unit generates a second error correcting code for the third page and the interface unit writes the first error correcting code and the second error correcting code as redundancy data of the first to third pages so as to be dispersed in the non-volatile memory cell.

5. The memory controller according to claim 1, further comprising:
   an error correcting unit that corrects an error with respect to data read from the non-volatile semiconductor memory,
   wherein the control unit instructs the encoding unit to generate an error correcting code for data other than the virtual page data among write data of two or more pages as a small bits of error correcting code having a lower correcting capability than the virtual page code, instructs the interface unit to store the small bits of error correcting code together with the write data of two or more pages in the non-volatile semiconductor memory, selects data other than the virtual page data from the write data of two or more pages read at the time of the reading from the non-volatile semiconductor memory, instructs the error correcting unit to correct the error based on the selected data and the small bits of error correcting code, and restores write data for every page based on the data in which the error is corrected.

6. The memory controller according to claim 1, further comprising:
   an error correcting unit that corrects an error with respect to data read from the non-volatile semiconductor memory,
   wherein the control unit instructs the encoding unit to generate an error correcting code for every page with respect to write data of two or more pages as a page error correcting code having a lower correcting capability than the virtual page code, instructs the interface unit to store the page error correcting code together with the write data of two or more pages in the non-volatile semiconductor memory, and instructs the error correcting unit to correct the error based on the restored write data and the page error correcting code after restoring write data for every page.

7. The memory controller according to claim 2, further comprising:
an error correcting unit that corrects an error based on the data read from the non-volatile semiconductor memory and the error correcting code,
wherein the interface unit reads the data for three pages and the first error correcting code from the non-volatile semiconductor memory, and
the control unit generates the virtual page from the read data for three pages and the error correcting unit corrects an error for the virtual page based on the first error correcting code.

8. The memory controller according to claim 2, wherein the encoding unit generates a second error correcting code for the third page and the interface unit writes the first error correcting code and the second error correcting code as redundancy data of the first to third pages so as to be dispersed in the non-volatile memory cell.

9. The memory controller according to claim 2, further comprising:
an error correcting unit that corrects an error with respect to data read from the non-volatile semiconductor memory,
wherein the control unit instructs the encoding unit to generate an error correcting code for data other than the virtual page data among write data of two or more pages as a small bits of error correcting code having a lower correcting capability than the virtual page code, instructs the interface unit to store the small bits of error correcting code together with the write data of two or more pages in the non-volatile semiconductor memory, selects data other than the virtual page data from the write data of two or more pages read at the time of the reading from the non-volatile semiconductor memory, instructs the error correcting unit to correct the error based on the selected data and the small bits of error correcting code, and restores write data for every page based on the data in which the error is corrected.

10. The memory controller according to claim 2, further comprising:
an error correcting unit that corrects an error with respect to data read from the non-volatile semiconductor memory,
wherein the control unit instructs the encoding unit to generate an error correcting code for every page with respect to write data of two or more pages as a page error correcting code having a lower correcting capability than the virtual page code, instructs the interface unit to store the page error correcting code together with the write data of two or more pages in the non-volatile semiconductor memory, and instructs the error correcting unit to correct the error based on the restored write data and the page error correcting code after restoring write data for every page.

11. A semiconductor memory system, comprising:
a non-volatile semiconductor memory including a memory cell of 3 bits/cell in which each of a plurality of 3bit values is allocated to each of a plurality of threshold voltage distribution distributions, a first bit represents a first page bit, a second bit represents a second page bit, and a third bit represents a third page bit;
upon writing data for three pages of the first page, the second page, and the third page to the first memory area of the non-volatile semiconductor memory, a control unit that selects one bit, from the first page bit and the second page bit, which becomes an error bit when a threshold voltage distribution moved to an adjacent threshold voltage distribution owing to charge leakage or flow, and generates a virtual page using the selected bits from the first page and the second page;
an encoding unit that generates a first error correcting code for the virtual page; and
an interface unit that writes the data for the three pages and the first error correcting code in the memory.

12. The semiconductor memory system according to claim 11, further comprising:
an error correcting unit that corrects an error based on the data read from the non-volatile semiconductor memory and the error correcting code,
wherein the interface unit reads the data for three pages and the first error correcting code from the non-volatile semiconductor memory, and
the control unit generates the virtual page from the read data for three pages and the error correcting unit corrects an error for the virtual page based on the first error correcting code.

13. The semiconductor memory system according to claim 11, wherein the encoding unit generates a second error correcting code for the third page and the interface unit distributes the first error correcting code and the second error correcting code as redundancy data of the first to third pages so as to be written in the non-volatile memory cell.

14. The semiconductor memory system according to claim 11, further comprising:
an error correcting unit that corrects an error with respect to data read from the non-volatile semiconductor memory,
wherein the control unit instructs the encoding unit to generate an error correcting code for data other than the virtual page data among write data of two or more pages as a small bits of error correcting code having a lower correcting capability than the virtual page code, instructs the interface unit to store the small bits of error correcting code together with the write data of two or more pages in the non-volatile semiconductor memory, selects data other than the virtual page data from the write data of two or more pages read at the time of reading from the non-volatile semiconductor memory, instructs the error correcting unit to correct the error based on the selected data and the small bits of error correcting code, and restores write data for every page based on the data in which the error is corrected.

15. The semiconductor memory system according to claim 11, further comprising:
an error correcting unit that corrects an error with respect to data read from the non-volatile semiconductor memory,
wherein the control unit instructs the encoding unit to generate an error correcting code for every page with respect to write data of two or more pages as a page error correcting code having a lower correcting capability than the virtual page code, instructs the interface unit to store the page error correcting code together with the write data of two or more pages in the non-volatile semiconductor memory, and instructs the error correcting unit to correct the error based on the restored write data and the page error correcting code after restoring write data for every page.

* * * * *